(12) United States Patent
Kato et al.

(10) Patent No.: US 7,317,571 B2
(45) Date of Patent: Jan. 8, 2008

(54) CATADIOPTRIC PROJECTION OPTICAL SYSTEM, EXPOSURE APPARATUS HAVING THE SAME, DEVICE FABRICATION METHOD

(75) Inventors: Takashi Kato, Utsunomiya (JP); Chiaki Terasawa, Tochigi-ken (JP); Hirohiko Shinonaga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 108 days.

(21) Appl. No.: 11/196,378

(22) Filed: Aug. 2, 2005

(65) Prior Publication Data
US 2006/0028715 A1   Feb. 9, 2006

(30) Foreign Application Priority Data
Aug. 3, 2004   (JP)   ............................. 2004-227364

(51) Int. Cl.
*G02B 27/18* (2006.01)
(52) U.S. Cl. ...................... 359/364; 359/727; 359/732; 355/67
(58) Field of Classification Search ...................... None
See application file for complete search history.

(56) References Cited

U.S. PATENT DOCUMENTS 5,742,436 A * 4/1998 Furter ........................ 359/727
5,861,997 A   1/1999 Takahashi
7,030,958 B2 * 4/2006 Luijkx et al. ................. 355/30
2002/0044260 A1   4/2002 Takahashi et al.
2004/0233405 A1   11/2004 Kato et al.

FOREIGN PATENT DOCUMENTS

| JP | 8-62502 A | 3/1996 |
| JP | 2002-83766 A | 3/2002 |
| JP | 2002-182112 A | 6/2002 |

\* cited by examiner

*Primary Examiner*—Stephone B. Allen
*Assistant Examiner*—Derek S. Chapel
(74) *Attorney, Agent, or Firm*—Morgan & Finnegan LLP

(57) ABSTRACT

A catadioptric projection optical for forming an image of the intermediate image onto a second object, the catadioptric projection optical system include, a first dioptric group including a first lens group that has a positive refractive power and a second lens group that has a positive refractive power, a catadioptric group including a concave mirror and a third lens group that an incidence light and reflected light from the concave mirror pass, and a second dioptric group. A first deflective reflector is arranged between the first lens group and the second lens group. A second deflective reflector is arranged between the second lens group and the third lens group or between the third lens group and the second dioptric group. A first intermediate image is formed between the second lens group and the concave mirror. A second intermediate image is formed between the concave mirror and the second dioptric group.

7 Claims, 17 Drawing Sheets

CATADIOPTRIC PROJECTION OPTICAL SYSTEM, EXPOSURE APPARATUS HAVING THE SAME, DEVICE FABRICATION METHOD

BACKGROUND OF THE INVENTION

The present invention relates generally to a projection optical system, and more over particularly to a catadioptric projection optical system that projects and exposes an object, such as a single crystal substrate and a glass plate for a liquid crystal display ("LCD"), using a mirror. The present invention is suitable, for example, an immersion exposure apparatus (an immersion lithography exposure system) for exposing the object through a fluid between the projection optical system and the object.

The photolithography technology for manufacturing fine semiconductor devices, such as semiconductor memory and logic circuit, has conventionally employed a reduction projection exposure apparatus that uses a projection optical system to project and transfer a circuit pattern of a reticle (or mask) onto a wafer, etc. The recent, more highly semiconductor device (circuit pattern) require stricter specification and performance for a projection optical system. Generally, a shorter wavelength of the exposure light and/or a higher numerical aperture ("NA") is effective to improve resolution. Recently, an optical system with 1 or more of NA by an immersion optical system that fills a space with fluid between a final glass surface (in other words, the lens arranged at most wafer side) of the projection optical system and the wafer has been proposed, and further higher NA progresses.

With a short wavelength of the exposure light ranging such as an ArF excimer laser (with a wavelength of approximately 193 nm) and a $F_2$ laser (with a wavelength of approximately 157 nm) and the like for higher resolution, lens materials are limited to quartz and calcium fluoride for reduced transmittance. An optical system that includes only lenses (refracting element) uses, generally, quartz and calcium fluoride when the exposure wavelength is 193 nm for instance. However, the quartz and calcium fluoride are small differences in their dispersion values, and have difficulties in corrections to chromatic aberrations, especially, for the optical system that has very higher NA like the immersion optical system. Moreover, lens materials larges an aperture along with higher NA, and increases an apparatus cost. Various proposals that uses a mirror for an optical system have been made to solve the disadvantageous reduced transmittance, difficult chromatic aberrations corrections and large-aperture of lens materials (see, for example, Japanese Patent Application, Publication No. 2002-83766, Japanese Patent Application, Publication No. 8-62502, Japanese Patent Application, Publication No. 2002-182112). For example, a catadioptric projection optical system combining a catoptric system and a dioptric system has been disclosed in Japanese Patent Application, Publication No. 2002-83766 and Japanese Patent Application, Publication No. 8-62502. An example of adopting the catadioptric projection optical system to prevent the increase of the apparatus cost has been disclosed in Japanese Patent Application, Publication No. 2002-182112.

In configuring a projection optical system that includes the catoptric system with a shorter exposure wavelength and a higher NA, it is necessary to adopt an optical system that enables chromatic aberration corrections, obtains a large enough imaging area on an image surface, and feasible for further higher NA. Especially, when NA is higher further than about 1.1, an object-to-image distance (in other words, a distance between the reticle and the wafer), and an effective diameter of lens materials becomes very large. Therefore, neither an enlargement of the optical system nor the increase of the apparatus cost are avoided.

An optical system shown in FIG. 13 of Japanese Patent Application, Publication No. 2002-83766 and an optical system shown in FIGS. 7 and 9 of Japanese Patent Application, Publication No. 8-62502 are a three-time imaging catadioptric optical system for forming an intermediate image twice. It includes a first imaging optical system for forming a first intermediate image of a first object (e.g., a reticle), a second imaging optical system that includes a concave mirror and forms a second intermediate image from the first intermediate image, and a third imaging optical system for forming the second intermediate image onto a second object surface (e.g., a wafer). The second imaging optical system includes concave mirrors as a reciprocating optical system (double-pass optical system).

The optical system with an NA of 0.75 in FIG. 13 of Japanese Patent Application, Publication No. 2002-83766 arranges a plane mirror (reflection block) near the first and second intermediate images, and aligns optical axes of the first and third imaging optical system with each other. Thus, the first object and the second object are arranged in parallel. However, such an optical system considerably enlarges when NA becomes 1 or more such as the immersion optical system, especially, about 1.1 or more. Because the first imaging optical system from the first object to near the plane mirror and the third imaging optical system from near the plane mirror to the second object are arranged on a straight optical axis, a sum of the object-to-image distance of the first imaging optical system and the object-to-image distance of the third imaging optical system becomes the the object-to-image distance (the distance between the reticle and the wafer) of the entire optical system. It is necessary to strong a refractive power of each lens to prevent the enlargement of the optical system according to a higher NA, and the aberration correction becomes difficult. Moreover, because a reduction magnification larges by the first imaging optical system, the first intermediate image larges NA of the first intermediate image for an object side NA in the first object at only the reduction magnification. As a result, an incidence angle range and the maximum incidence angle to the plane mirror increase, and it becomes a serious problem for further higher NA by the immersion etc. In other words, the incidence angle range and the maximum incidence angle to the plane mirror considerably increase, and a deterioration of an imaging performance is not avoided by an influence of a deterioration of plane mirror characteristic etc. Because the plane mirror is arranged near the second intermediate image, the second intermediate image is also similar.

An optical system with NAs of 0.45 to 0.5 in FIGS. 7 and 9 of Japanese Patent Application, Publication No. 8-62502 is similarly a catadioptric projection optical system for forming an image three-times or an intermediate image twice. In this optical system, neither the first object (reticle) nor the second object (wafer) are a position relationship of the parallel. The imaging performance in a scanning exposure can be improved, and a stability performance can be maintained by arranging the first object and the second object in especially vertically for gravity and in parallel. Therefore, it is undesirable to develop an exposure apparatus that has the optical system with a higher NA by the immersion etc. that neither the first object nor the second object are the position relationship of the parallel. This optical system needs another plane mirror to arrange a first object and a second object in parallel. In that case, as described in Japanese Patent Application, Publication No. 2002-83766, a mirror provides the same arrangement as the optical system in FIG. 13 of Japanese Patent Application, Publication No. 20002-83766 if arranged near the first intermediate image. A paraxial magnification of the first imaging optical system or the second imaging optical system is the reduction magnification, and is allotted to a paraxial magnification of entire system. If such power arrangement is composed, the incidence angle range and the maximum incidence angle to the plane mirror arranged near the second intermediate image increase, and a light separation of light near the first intermediate is difficult, for further higher NA, especially, NA over 1 by the immersion. Moreover, because the reciprocating optical system (double-pass optical system) includes only the concave mirror and a negative lens, an incidence angle of a principal ray that enters the plane mirror arranged near the second intermediate image inevitably considerably increase more than 45 degrees, and the maximum incidence angle to the light that enters the plane mirror considerably increases.

In the optical system in FIG. 13 of Japanese Patent Application, Publication No. 2002-83766 and the optical system in FIGS. 7 and 9 of Japanese Patent Application, Publication No. 8-62502, because an absolute value of the paraxial magnification is small, a pupil position of the first imaging optical system is nearer the first intermediate image than the first object. Therefore, if the plane mirror is arranged in the first imaging optical system, the distance from the first object to the plane mirror becomes long, and the distance between the first object and the second object becomes long. As a result, the problem that the object-to-image distance that is the distance from the first object to the second object becomes long is caused.

On the other hand, an optical system in Japanese Patent Application, Publication No. 2002-182112 uses a beam splitter, is a three-time imaging catadioptric optical system that uses an i-line for a light source, and arranges one common beam splitter at the pupil position on a common optical axis of the first imaging optical system and the second imaging optical system. However, a fabrication of a beam splitter that achieves an optical performance demanded along with a higher NA by the immersion and further shorter wavelength such as ArF excimer laser and $F_2$ laser is very difficult and leads to the cost-up. For example, in the optical system with 1.1 or more of NA, an effective diameter of lens material near the pupil of final imaging optical system considerably increases, the beam splitter enlarges, and such space is not easily secured in the optical system. Moreover, because a thickness of the lens material composed the beam splitter becomes very thick, the deterioration of the image performance by an exposure aberration is feared. In the optical system that used the beam splitter like the above references, it is very difficult to arrange the first object (reticle) and the second object (wafer) in parallel.

BRIEF SUMMARY OF THE INVENTION

The present invention is directed to a catadioptric optical system that can shorten the distance (object-to-image distance) between the first object (reticle) and the second object (wafer) can stability superior image performance, an exposure apparatus having the same, and device fabrication method.

A catadioptric projection optical system of one aspect of the present invention for forming an intermediate image of a first object twice and for forming an image of the intermediate image onto a second object, said catadioptric projection optical system comprising, in order from the first object side and along an optical axis of said catadioptric projection optical system, a first dioptric group that does not form a reciprocating optical system (double-pass optical system) that an incidence light and reflected light pass, said first dioptric group including a first lens group that has a positive refractive power and a second lens group that has a positive refractive power, a catadioptric group that forms the reciprocating optical system (double-pass optical system), said catadioptric group including a third lens group that forms the reciprocating optical system (double-pass optical system), a second dioptric group that does not form the reciprocating optical system (double-pass optical system), a first deflective reflector that arranges between the first lens group and the second lens group, and a second deflective reflector that arranges between the second lens group and the third lens group or between the second dioptric group and the third lens group.

A catadioptric projection optical system according to another aspect of the present invention for imaging an image of a first object onto a second object, said catadioptric projection optical system comprising, in order from the first object side and along an optical axis of said catadioptric projection optical system, a first imaging optical system for forming a first intermediate image of the first object, said first imaging optical system having at least one lens, a second imaging optical system for forming a second intermediate image of the first object, said second imaging optical system having at least one lens and one concave mirror, and a third imaging optical system for forming the image of the second intermediate image onto the second object, said third imaging optical system having at least one lens, wherein said first imaging optical system includes a first dioptric group, the first dioptric group includes, along with the optical path from the first object side, a first lens group that does not form a reciprocating optical system (double-pass optical system) that an incidence light and reflected light pass, a first deflective reflector, and a second lens group that does not form the reciprocating optical system (double-pass optical system), wherein 15°<θp<45° is met, where θp is an incidence angle of a principal ray that enters the first deflective reflector.

An exposure apparatus according to still another aspect of the present invention includes the above illumination optical system for illuminating a reticle with a light from a light source, and a catadioptric projection system for projecting a pattern of the reticle onto an object to be exposed.

A device fabrication method according to another aspect of the present invention includes the steps of exposing an object using the above exposure apparatus, and performing a development process for the object exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
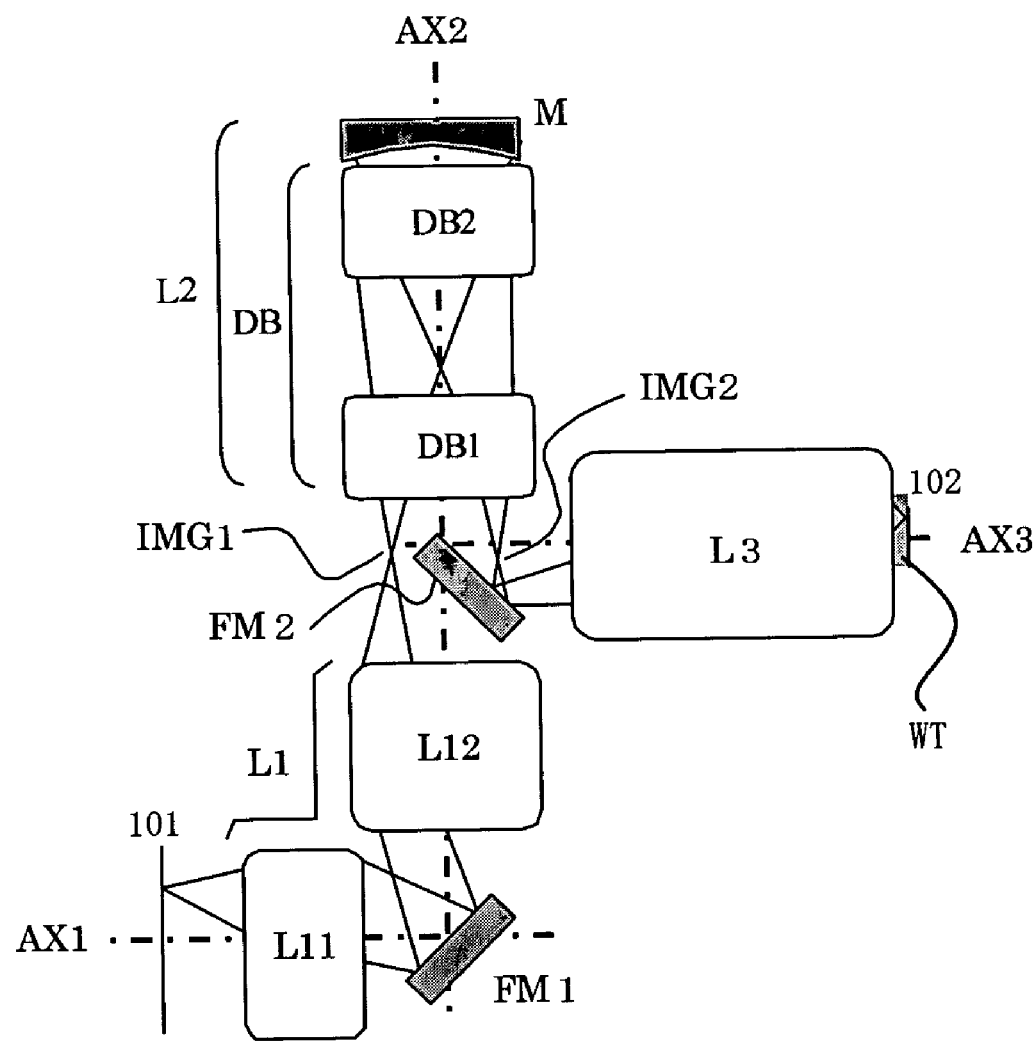
FIG. 1 is a schematic sectional view of a catadioptric projection optical system according to the present invention.

With reference to the accompanying drawings, a description will be given of a catadioptric projection optical system according to one aspect of the present invention. In each figure, the same reference numeral denotes the same element. Therefore, duplicate descriptions will be omitted. Here, FIG. 1 is a schematic sectional view of a catadioptric projection optical system 100 of the present invention.

101 denotes a first object (e.g., a reticle) and 102 a second object (e.g., a wafer). AX1 to AX3 are optical axes of optical systems. The catadioptic projection optical system 100 is a tree-times imaging system for forming an intermediate image (real image) twice. The catadioptic projection optical system 100 includes, in order from the first object 101 side, a first imaging optical system, a second imaging optical system, and a third imaging optical system.

The first imaging optical system forms an image of the first object 101 (a first intermediate image IMG1). The light from the first intermediate image IMG1 then forms a second intermediate image IMG2 as the real image with the second imaging optical system, which includes a concave mirror M. The third imaging optical system forms an image of the intermediate image IMG2 as the real image onto the second object 102. In instant embodiment, the catadioptric projection optical system 100 is an immersion optical system that fills a space with fluid WT between the second object 102 and a final lens surface (in other words, the lens surface at most second object 102 side).

The catadioptic projection optical system 100 includes, in order from the first object 101 side, a lens group (first dioptric group) L1 that has at least one lens and does not form a reciprocating optical system (double-pass optical system), a catadioptric group L2 that has at least one lens and form the reciprocating optical system (double-pass optical system), and a lens group (second dioptric group) L3 that has at least one lens and does not form the reciprocating optical system (double-pass optical system).

The lens group L1 includes a lens group (first lens group) L11 that has at least one lens and a positive refractive power, and a lens group (second lens group) L12 that has at least one lens and a positive refractive power. The catadioptric group L2 includes a lens group (third lens group) DB that forms the reciprocating optical system (double-pass optical system), and a concave mirror M.

The catadioptric projection optical system 100 includes two deflective reflectors (a first deflective reflector and a second deflective reflector) FM1 and FM2, other deflective reflector is arranged between the lens group L11 and the lens group L12, and the other deflective reflector is arranged between the lens group L3 and the lens group DB that forms the reciprocating optical system (double-pass optical system).

The first deflective reflector FM1 arranged in the lens group L1 bends the optical axis AX1 and deflects a light from the first object 101 as shown in FIG. 1. The second deflective reflector FM2 deflects a light reflected at the concave mirror M and deflects the optical axis AX2 to the optical axis AX3.

The first object 101 and the second object 102 are arranged in parallel. The optical axis AX2 of the concave mirror M is orthogonally arranged for each normal of the first object 101 and normal of the second object 102. However, the concave mirror M may be not necessary to orthogonalize to the first object 101 and the second object 102. Because the optical axis AX1 and the optical axis AX2 are parallel, and the first object 101 and the second object 102 are arranged in parallel, the optical axis AX2 needs not necessary to always orthogonalize to the optical axis AX1 and the optical axis AX3. In other words, each normals of the first deflective reflector FM1 and the second deflective reflector FM2 may be arranged to be substantially 90 degrees. The first object 101 and the second object 102 do not need to be parallel, but is desirable in the parallel considering composing the exposure apparatus.

A pupil of the first imaging optical system and a pupil of the third imaging optical system exist respectively in the lens group L1 and the lens group L3, and a position on the optical axis is different.

Thus, the catadioptric projection optical system 100 adopts the triple imaging system, arranges the first deflective reflector FM1 between the lens group L11 and the lens group L12, arranges the second deflective reflector FM2 between the catadioptric group L2 that forms the reciprocating optical system (double-pass optical system) and the lens group L3. Therefore, the catadioptric projection optical system 100 can achieve a projection optical system that reduces an object-to-image distance and effective diameter, does not shade a center part of the pupil, and images a non-axial light, as the triple imaging system for a higer NA.

The lens group DB includes a lens group (fourth lens group) DB1 that has a positive refractive power and a lens group (fifth lens group) DB2 that has a negative refractive power, and desirable to arrange, in order near the concave mirror M, in order of the lens group DB2 and the lens group DB1. The refractive power of the concave mirror M can be strengthened, large negative Petzval sum is generated by the lens group DB2 and the concave mirror M, and a positive Petzval sum generated by other lens groups can be effectively cancelled (denied), by arranging the lens group DB2 that has the negative refractive power just before the concave mirror M.

The lens group DB1 that has the positive refractive power can reduce the maximum incidence angle of a light that enters the second deflective reflector FM2, can shorten a distance between the second deflective reflector FM2 and the second object 102, and can shorten the distance between the first object 101 and the second object 102 (object-to-image distance). The lens group DB1 that has the positive refractive power has at least one lens that has a positive refractive power. The lens group DB2 that has the negative refractive power has at least one lens that has a negative refractive power.

The catadioptric group L2 may have at least one lens that has an aspheric surface. If the lens that has the aspheric surface is not used, the lens group DB that forms the reciprocating optical system (double-pass optical system) is composed by using plural lenses, and the refractive power may be allotted. Of course, if the lens that has the aspheric surface is used, an aberration generation in a part formed the reciprocating optical system (double-pass optical system) can be decreased, and the aberration generated in other lens groups can be effectively corrected, by composing the lens group DB using plural lenses. Moreover, the concave mirror M may have the aspheric surface.

In the catadioptric projection optical system 100 of the present invention, the first imaging optical system includes at least the lens group L11 and the lens group L12, the second imaging optical system includes at least the lens group DB2 that has the negative refractive power and the concave mirror M, and the third imaging optical system includes at least the lens group L3.

However, the catadioptric projection optical system 100 of the present invention is not limited to the structure shown in FIG. 1, may be structures shown in FIGS. 2 to 8. FIGS. 2 to 8 are schematic sectional views of catadioptric projection optical systems 100A to 100F according to the present invention. FIGS. 2 to 5 show a difference of position formed the intermediate image.

Figure 2:
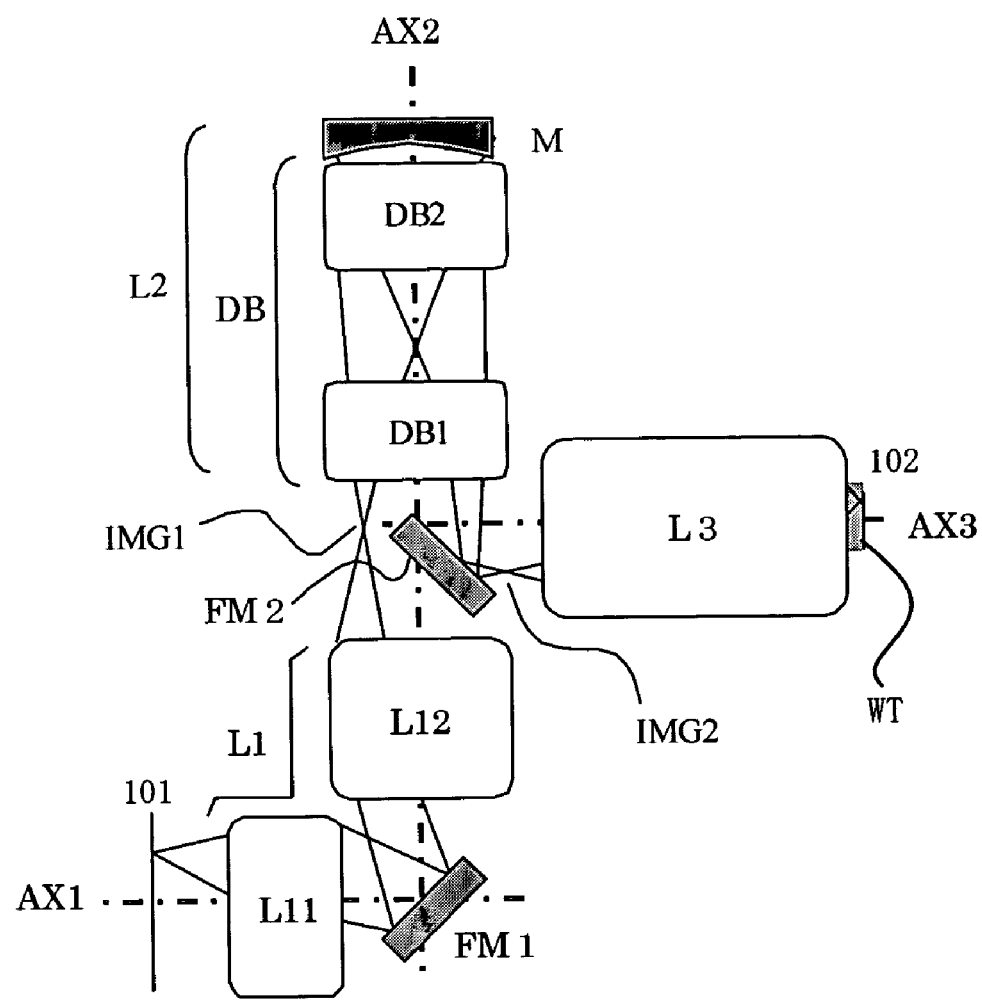
FIG. 2 is a schematic sectional view of another catadioptric projection optical system according to the present invention.

The catadioptric projection optical system 100A as shown in FIG. 2 is different to form the second intermediate image IMG2 between the second deflective reflector FM2 and the lens group L3 compared with the catadioptric projection optical system 100 shown in FIG. 1. When the second intermediate image IMG2 is formed near the second deflective reflector FM2, the second intermediate image IMG2 may exist between the lens group L3 that does not form the reciprocating optical system (double-pass optical system) and has the positive refractive power and the second deflective reflector FM2, or between the lens group DB1 that forms the reciprocating optical system (double-pass optical system) and has the positive refractive power and the second deflective reflector FM2. Because if the intermediate image exists on the second deflective reflector FM2, an influence of a wound and dust of the second deflective reflector FM2 and an influence of processing error etc. strongly influence the deterioration of the imaging performance. However, if these problems are solved, the second intermediate image IMG2 may be formed on the second deflective reflector FM2.

Figure 3:
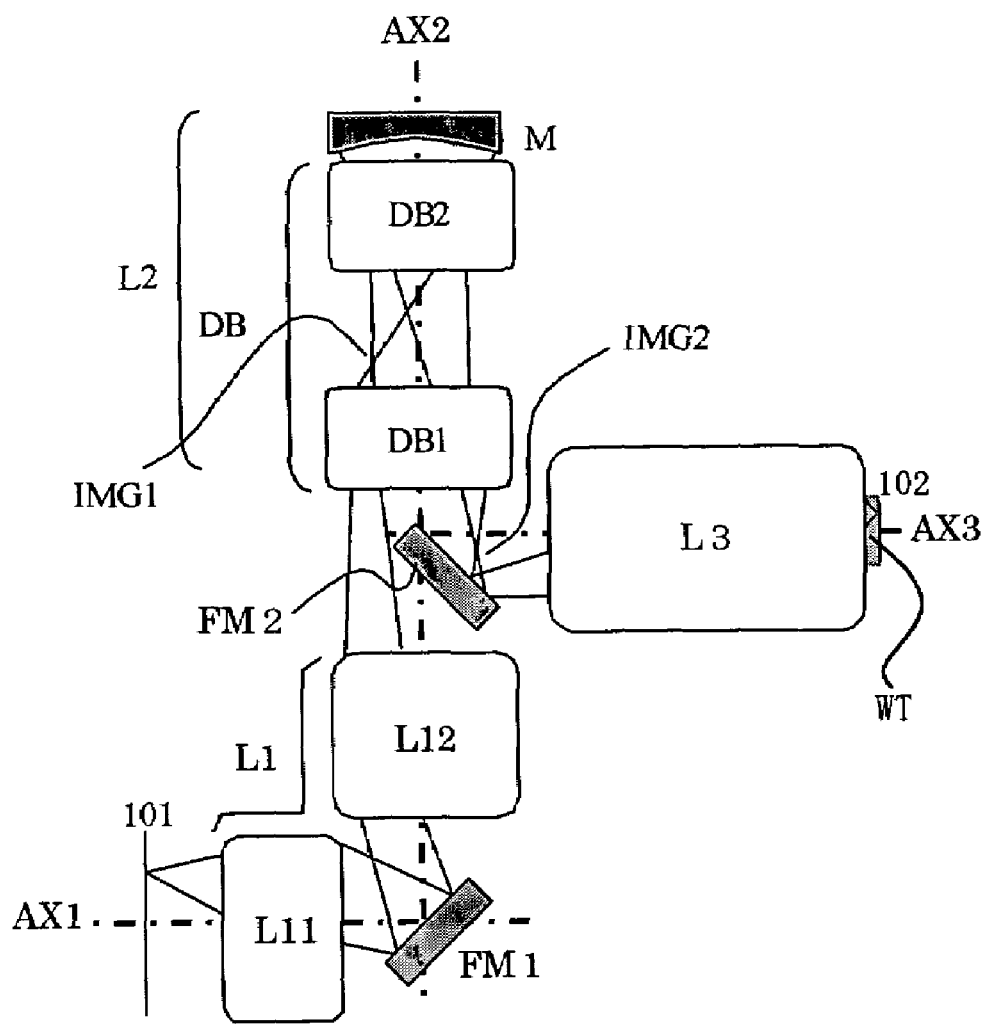
FIG. 3 is a schematic sectional view of another catadioptric projection optical system according to the present invention.
Figure 4:
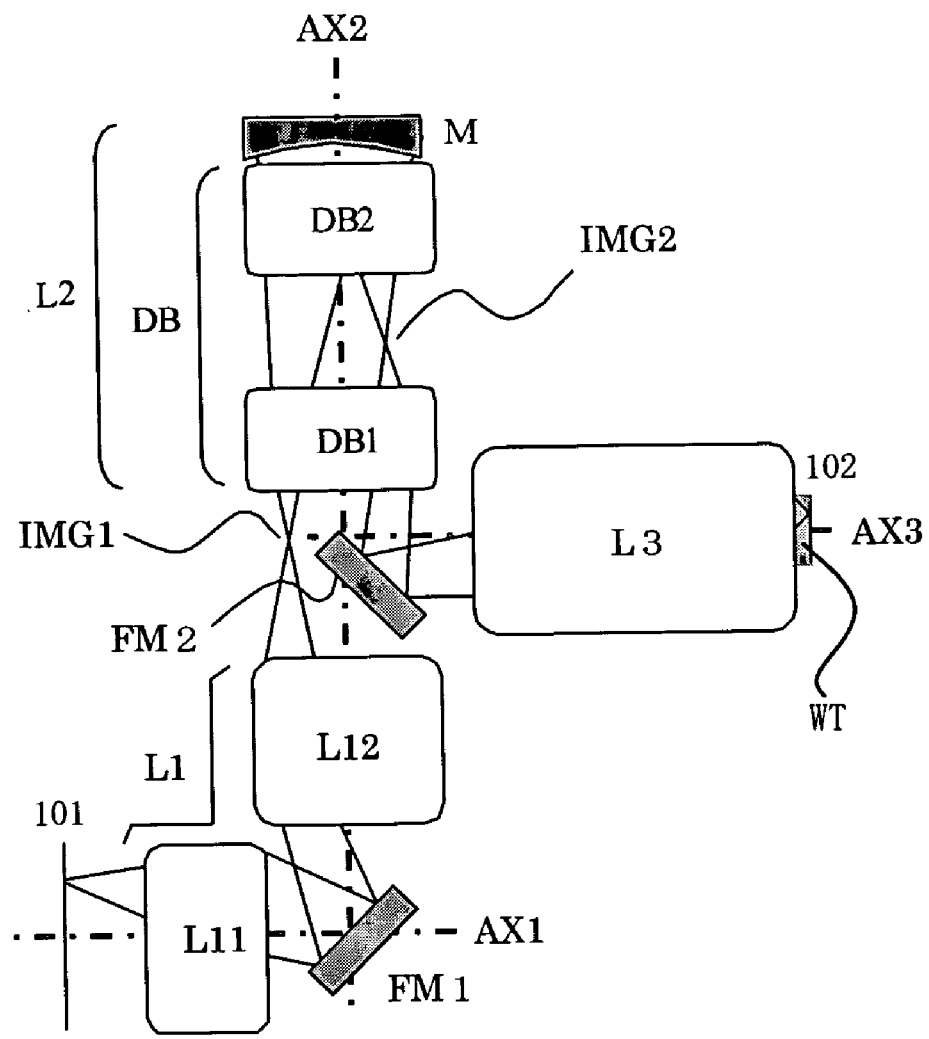
FIG. 4 is a schematic sectional view of another catadioptric projection optical system according to the present invention.
Figure 5:
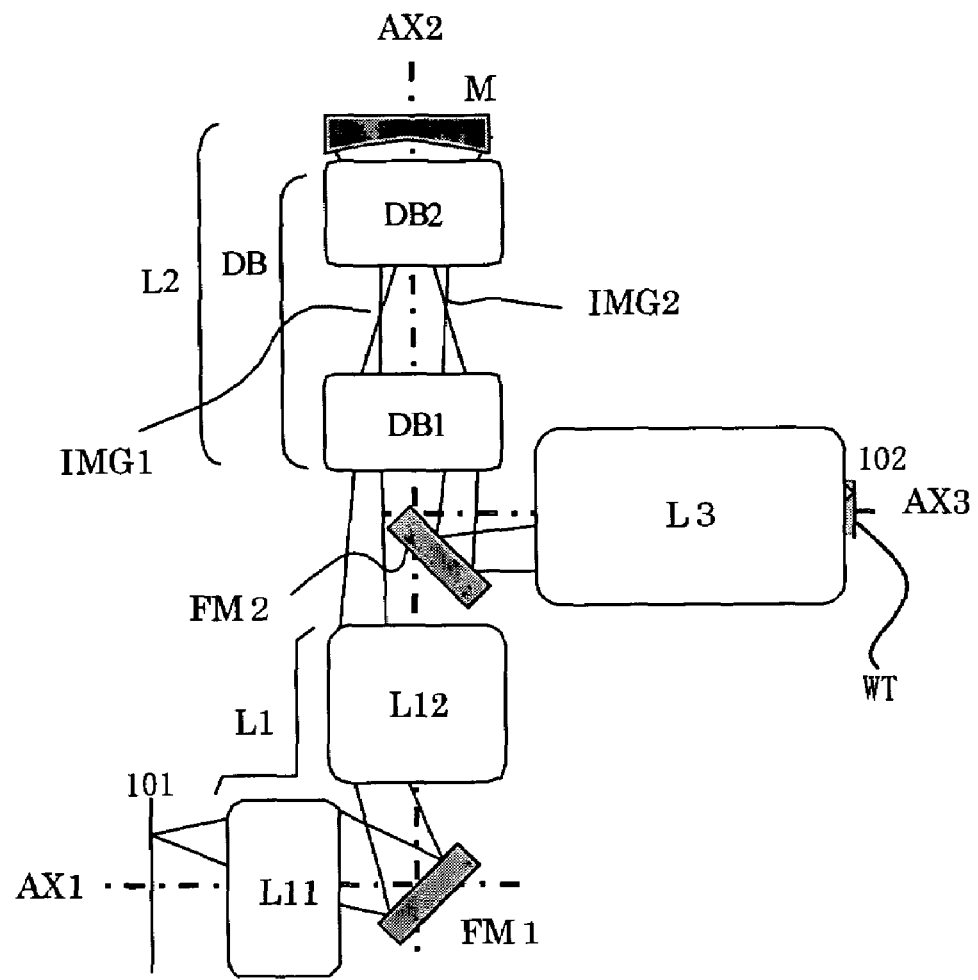
FIG. 5 is a schematic sectional view of another catadioptric projection optical system according to the present invention.

The catadioptric projection optical system 100B as shown in FIG. 3 is different to form the first intermediate image IMG1 between the lens group DB1 that forms the catadioptric group L2 and the lens group DB2 compared with the catadioptric projection optical system 100 shown in FIG. 1. The catadioptric projection optical system 100C as shown in FIG. 4 is different to form the second intermediate image IMG2 between the lens group DB1 that forms the catadioptric group L2 and the lens group DB2 compared with the catadioptric projection optical system 100 shown in FIG. 1. The catadioptric projection optical system 100D as shown in FIG. 5 is different to form the first intermediate image IMG1 and the second intermediate image IMG2 between the lens group DB1 that forms the catadioptric group L2 and the lens group DB2 compared with the catadioptric projection optical system 100 shown in FIG. 1.

Figure 6:
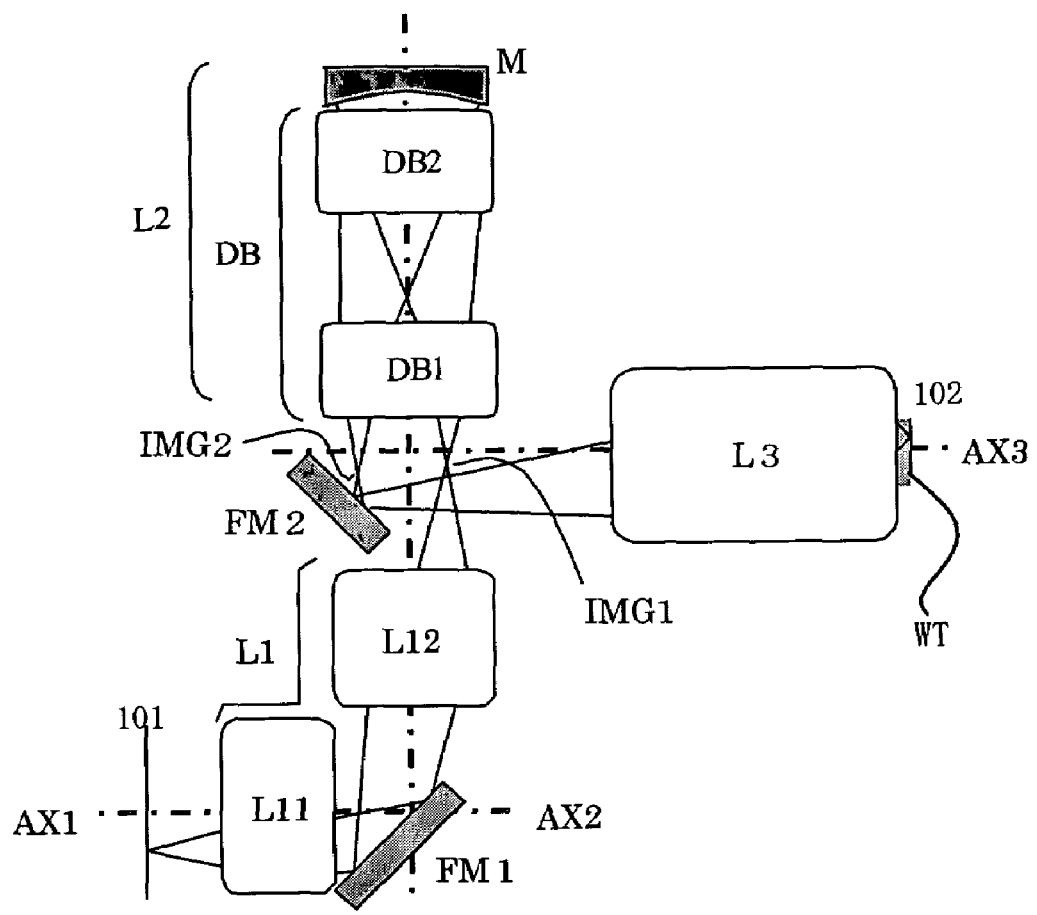
FIG. 6 is a schematic sectional view of another catadioptric projection optical system according to the present invention.

The catadioptric projection optical system 100E as shown in FIG. 6 is different to arrange so that a light facing from the lens group L12 to the concave mirror M crosses a light that is reflected by the second deflective reflector FM2 and enters the lens group L3 compared with the catadioptric projection optical system 100 shown in FIG. 1.

The position formed the first intermediate image IMG1 and the second intermediate image IMG2 is not limited to positions shown in FIGS. 1 to 6, and may be formed in the lens group DB1 that forms the reciprocating optical system (double-pass optical system) for instance. It is desirable that the first intermediate image IMG1 is formed between the lens group L12 and the concave mirror M, and more desirable that the first intermediate image IMG1 is formed between the lens group L12 and the lens group DB2 that has the negative refractive power. On the other hand, it is desirable that the second intermediate image IMG2 is formed between the concave mirror M and the lens group L3, and it is more desirable that the second intermediate image IMG2 is formed between the lens group L3 and the lens group DB2 that has the negative refractive power.

Figure 7:
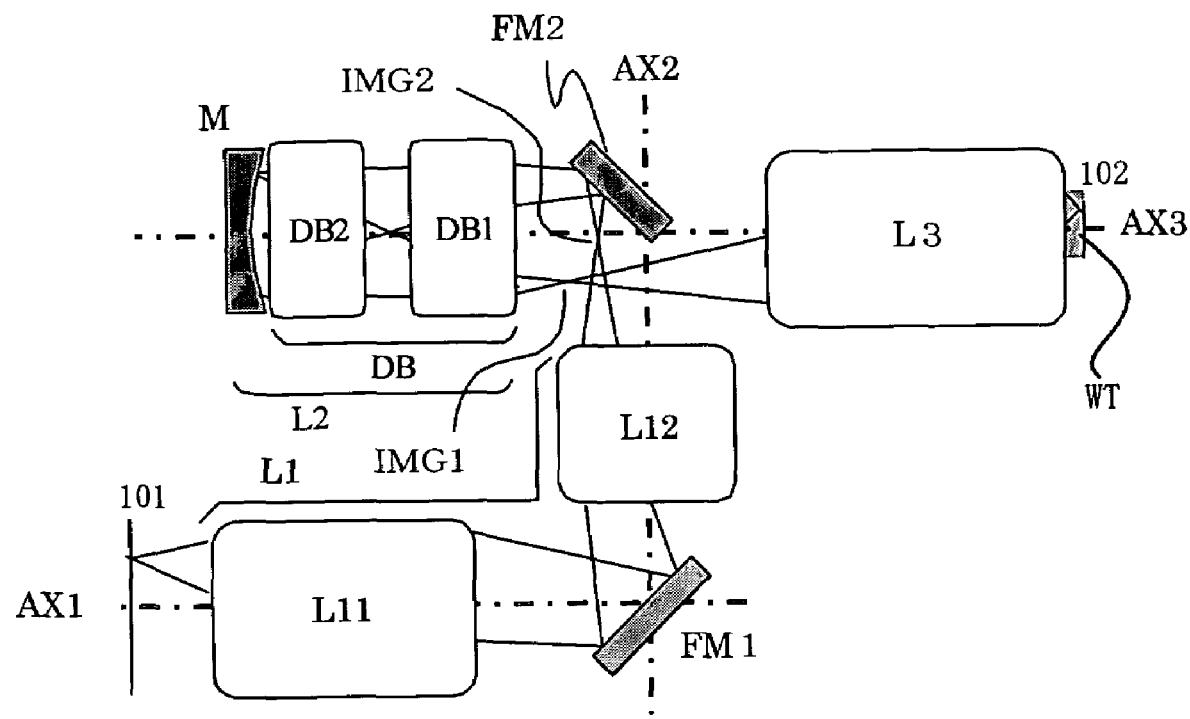
FIG. 7 is a schematic sectional view of another catadioptric projection optical system according to the present invention.
Figure 8:
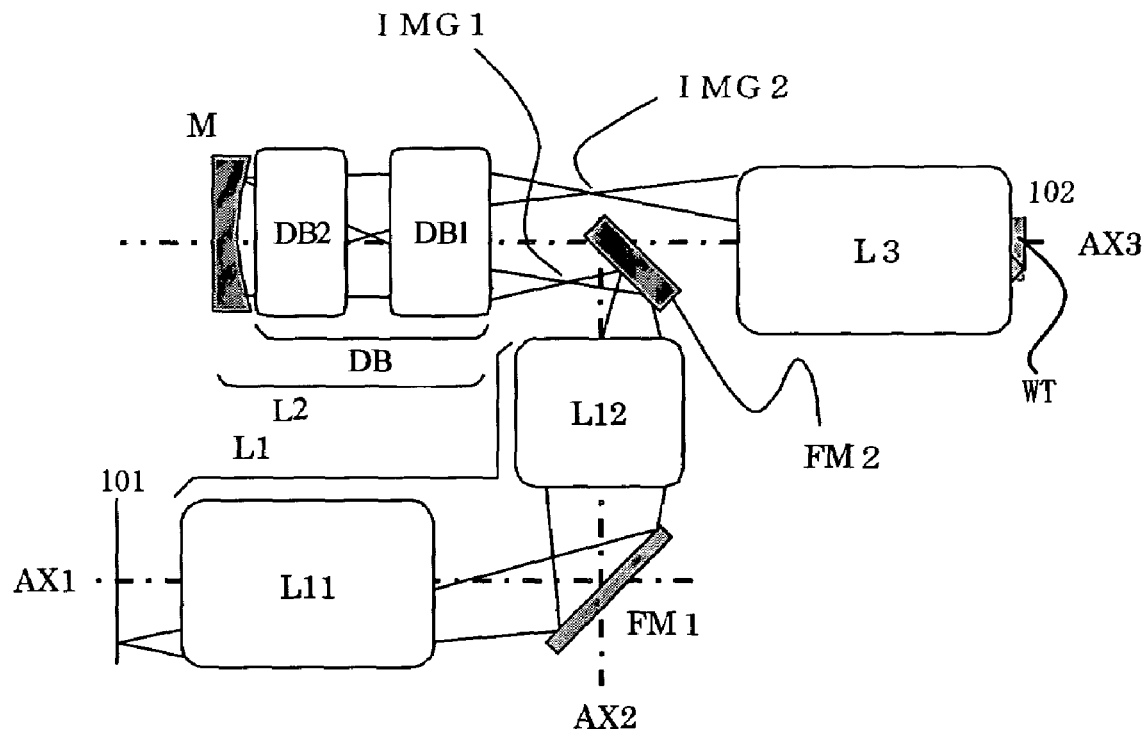
FIG. 8 is a schematic sectional view of another catadioptric projection optical system according to the present invention.

Cataoptric projection systems 100F and 100G shown in FIGS. 7 and 8 is different to arrange so that the first deflective reflector FM1 locates across the lens group L12 from the second deflective reflector FM2. In the cataoptric projection systems 100F and 100G, the concave mirror M is arranged opposite to the second object 102.

Referring to FIG. 7, the cataoptric projection system 100F is an arrangement that a light from the lens group L12 to the second deflective reflector FM2 crosses a light from the lens group DB1 that form the reciprocating optical system (double-pass optical system) to the lens group L3. Referring to FIG. 8, the catadioptric projection system 100G is an arrangement that a light from the second deflective reflector FM2 to the lens group DB1 that forms the reciprocating optical system (double-pass optical system) does not cross a light from the lens group DB1 to the lens group L3.

The second deflective reflector FM2 is arranged between the lens group L12 and the concave mirror M, concretely, between the lens group L12 and the lens group DB that forms the reciprocating optical system (double-pass optical system) for catadioptric projection systems 100F and 100G. Similarly in catadioptric projection systems 100F and 100G, it is desirable that the first intermediate image IMG1 is formed between the lens group L12 and the concave mirror M, and more desirable that the first intermediate image IMG1 is formed between the lens group L12 and the lens group DB2 that has the negative refractive power. On the other hand, it is desirable that the second intermediate image IMG2 is formed between the concave mirror M and the lens group L3, and it is more desirable that the second intermediate image IMG2 is formed between the lens group L3 and the lens group DB2 that has the negative refractive power.

Thus, catadioptric projection optical systems 100A to 100G adopts the triple imaging system, arranges the first deflective reflector FM1 between the lens group L11 and the lens group L12, and arranges the second deflective reflector FM2 between the catadioptric group L2 that forms the reciprocating optical system (double-pass optical system) and the lens group L3 or between the lens group L12 that has the lens group L1 that does not form the reciprocating optical system (double-pass optical system) and the lens group DB that forms the reciprocating optical system (double-pass optical system). Therefore, catadioptric projection optical systems 100A to 100G can achieve a projection optical system that reduces an object-to-image distance and effective diameter, does not shade a center part of the pupil, and images a non-axial light, as the triple imaging system for a higer NA.

At arrangements of catadioptric projection optical systems 100 to 100D and 100F shown in FIGS. 1 to 5 and 7, preferably, the following conditional expression is met, where θp is an incidence angle of a principal ray that enters the first deflective reflector FM1 arranged between the lens group L11 that does not forms the reciprocating optical system (double-pass optical system) and has the positive refractive power and the lens group L12.

$$15° < θp < 45° \quad (1)$$

In the conditional expression 1, θp is an angle between a principal ray of an object point from lowest object point to highest object point and a normal of a reflection surface of the first deflective reflector FM1.

If a value is lower than the lower limit in the conditional expression 1, the refractive power of peripheral lens excessively strengthen and the imaging performance is deteriorated, or peripheral lens excessively enlarges and securing a space of deflective reflector peripheral is difficult. If a value exceeds the upper limit in the conditional expression 1, an angle of a ray incident upon the first deflective reflector FM1 excessively enlarges and a design difficulty to make superior film characteristic of the first deflective reflector FM1 raises. The optical system may be designed so as not to exceed the upper limit in the conditional expression 1 to effectively lower the design difficulty.

More preferably, the incidence angle θp satisfies the following expression.

$$20° < θp < 45° \quad (2)$$

Moreover, preferably, the following expressions are met.

$$4.0 < |βL1/β| < 24.0 \quad (3)$$

$$0.01 < |βL3/NA| < 0.3 \quad (4)$$

The conditional expression 3 defines a ratio of a paraxial magnification β of the entire optical system and a paraxial magnification βL1 of the lens group L1. If a value is lower than the lower limit in the conditional expression 3, a pupil position of the first imaging optical system moves in a direction away from the first object 101 (direction of the concave mirror M in the second imaging optical system) along with the optical path and a distance between the optical path AX2 and the first object 101 becomes long. A light from the first deflective reflector FM1 and a light from the concave mirror M to the second deflective reflector FM2 becomes unavoidable. Moreover, an extension (NA) of a light that enters the second deflective reflector FM2 enlarges, and the film characteristic of the second deflective reflector FM2 is deteriorated.

On the other hand, if a value exceeds the upper limit in the conditional expression 3, the first intermediate image IMG1 excessively enlarges, a lens near the second intermediate image IMG2 has an excessively large effective diameter, and a load of reduced magnification with other imaging optical system increases.

The conditional expression 4 defines a ratio of a paraxial magnification βL3 of the lens group L3 and a numerical aperture NA of the entire system. If a value is lower than the lower limit in the conditional expression 4, a magnification of the lens group L3 excessively becomes a reduction system for NA of the optical system, the aberration correction becomes difficult, and a distance between the second deflective reflector FM2 and the second object 102 becomes long.

On the other hand, if a value exceeds the upper limit in the conditional expression 4, the extension (NA) of the light that enters the second deflective reflector FM2 enlarges, and the film characteristic of the second deflective reflector FM2 is deteriorated.

More preferably, the ratio of the paraxial magnification β of the entire optical system and the paraxial magnification βL1 of the lens group L1, and the ratio of the paraxial magnification βL3 of the lens group L3 and the numerical aperture NA of the entire system satisfy the following expressions.

$$4.5 < |βL1/β| < 12.0 \quad (5)$$

$$0.03 < |βL3/NA| < 0.2 \quad (6)$$

The magnification load of the lens group L1 and the lens group L3 can become proper by satisfying the conditional expression 5 and the conditional expression 6, and the optical system that has a small effective diameter and superior imaging performance can be easily achieved.

Preferably, the catadioptric optical system 100 of the present invention satisfies the following expression, where NA is a numerical aperture of the image side.

$$1.0 < NA < 1.8 \quad (7)$$

If a value is lower than the lower limit in the conditional expression 7, it is difficult to obtain an expected resolution when the immersion optical system is composed for the catadioptric system. On the other hand, if a value exceeds the upper limit in the conditional expression 7, the immersion optical system has an excessively large effective diameter, and the fabrication of the lens is difficult.

More preferably, the numerical aperture NA of the image side of the catadioptric optical system 100 satisfies the following expression.

$$1.2 < NA < 1.65 \quad (8)$$

Moreover, at arrangements of catadioptric projection optical systems 100 to 100D shown in FIGS. 1 to 5, preferably, the following conditional expression is met, where θp2 is an incidence angle of a most off-axis principal ray that enters the second deflective reflector FM2 arranged between the lens group DB1 that forms the reciprocating optical system (double-pass optical system) and has the positive refractive power and the lens group L3 that does not form the reciprocating optical system (double-pass optical system) and has the positive refractive power.

$$15° < θp2 < 45° \quad (9)$$

In the conditional expression 9, θp2 is an angle between a principal ray of an object point from lowest object point to highest object point and a normal of a reflection surface of the second deflective reflector FM2.

If a value is lower than the lower limit in the conditional expression 9, the refractive power of peripheral lens excessively strengthen and the imaging performance is deteriorated, or peripheral lens excessively enlarges and securing a space of deflective reflector peripheral is difficult. If a value exceeds the upper limit in the conditional expression 9, an angle of a ray incident upon the second deflective reflector FM2 excessively enlarges and a design difficulty to make superior film characteristic of the second deflective reflector FM2 rises. The optical system may be designed so as not to exceed the upper limit in the conditional expression 9 to effectively lower the design difficulty. If the design of the film of he second deflective reflector FM2 may rise, it is not restricted by the upper limit in the conditional expression 9.

More preferably, the incidence angle $\theta p2$ satisfies the following expression.

$$20°<\theta p2<45° \quad (10)$$

The catadioptric projection optical system 100 can enough correct the positive Petzval sum caused in the lens group L1 that does not form the reciprocating optical system (double-pass optical system) and the lens group L3 that does not form the reciprocating optical system (double-pass optical system) by the negative Petzval sum caused in the catadioptric group L2 that forms the reciprocating optical system (double-pass optical system) If the following conditional expressions are met, the imaging optical system with a small curvature of field can be achieved, where P1 is Petzval sum of the lens group L1 that does not form the reciprocating optical system (double-pass optical system), P2 is Petzval sum of the catadioptric group L2 that forms the reciprocating optical system (double-pass optical system), and P3 is Petzval sum of the lens group L3 that does not form the reciprocating optical system (double-pass optical system).

$$P1>0 \quad P2<0 \quad P3>0 \quad (11)$$

$$|P1+P2+P3|<0.1 \quad (12)$$

When the conditional expression 11 is not satisfied, for example, if the Petzval sum of the catadioptric group L2 that froms the reciprocating optical system (double-pass optical system) is zero or positive value, the effect that can excellently correct the Petzval sum by using the concave mirror M, and prevent the enlargement of effective diameter is lost in the catadioptric projection optical system (triple imaging system) 100 of the present invention compared with an optical system composed only of lens.

If the Petzval sum of the lens group L1 and/or lens group L3 that does not form the reciprocating optical system (double-pass optical system) is zero or negative value, it is difficult to compose the lens group L1 and the lens group L3 only of the lens. Moreover, if the lens group L1 and the lens group L3 are composed only of the lens, a lot of strong negative lenses are needed in the lens group. Therefore, the number of the lens that composes the optical system excessively increases, and the problem of the exposure aberration becomes serious or the cost rises.

When the concave mirror M is arranged in the lens group L1 or the lens group L3 so that the Petzval sum of the lens group L1 and/or the lens group L3 that does not form the reciprocating optical system (double-pass optical system) becomes zero or negative value, the reflected light from the concave mirror M returns near the first object 101 in the former. Therefore, physical interference of the first object (for example, reticle), returned light and nearby lens is easily caused, and the mechanism structure is difficult. On the other hand, the latter should be used the concave mirror M in the final imaging optical system. Therefore, if the optical system with a higher NA is achieved, the light separation is difficult.

When the conditional expression 12 is not satisfied, the curvature of field increases, and the imaging performance is considerably deteriorated. However, when the slit shape is an annular shape etc., the conditional expression 11 and the conditional expression 12 may be not satisfied. It is because the imaging performance in a part of the used image point only has to be superior even if the image surface has curved. If the slit shape is rectangular shape, similarly, the conditional expression 11 and the conditional expression 12 may be not satisfied for using extremely part of image point.

Preferably, the following conditional expression is met, where $\phi M$ is an effective diameter of the concave mirror M, and hM is a height of the most off-axial principal ray from the optical axis AX2 in the concave mirror M.

$$-0.10<hM/\phi M<0.10 \quad (13)$$

Thus, an arrangement of the concave mirror M near the pupil can suppress a generation of astigmatism, etc. that correction is difficult.

Preferably, the following conditional expression is met, where DOAX is an all optical axis distance along an traveled path of a ray from the first object 101 to the second object 102, and DRW is an object-to-image distance between the first object 101 and the second object 102 (distance of both when the first object 101 and the second object 102 are arrangement in parallel).

$$0.2<DRW/DOAX<0.58 \quad (14)$$

If a value is lower than the lower limit in the conditional expression 14, the object-to-image distance DRW excessively shortens compared with the all optical path DOAX along the traveled path of the ray. Therefore, the refractive power of each lens group strengthens, and the correction of the aberration is difficult. Moreover, the lens group L3 and the optical axis AX2 excessively approach, and the mechanism structure is difficult.

On the other hand, if a value exceeds the upper limit in the conditional expression 14, the object-to-image distance DRW excessively becomes excessively long compared with the all optical path DOAX along the traveled path of the ray. Therefore, the optical system excessively enlarges for the optical system with a more higher NA such as the immersion optical system.

Here, for example, in the catadioptric projection optical system 100, the all optical path distance DOAX is denoted by DOAX=(a distance from the first object 101 to the first deflective reflector FM1)+(a distance from the first deflective reflector FM1 to the concave mirror M)+(a distance from the concave mirror M to the second deflective reflector FM2)+(a distance from the second deflective reflector FM2 to the second object 102), the object-to-image distance DRW is denoted by DRW=(a distance from the first object 101 to the first deflective reflector FM1)+(a distance from the second deflective reflector FM2 to the second object 102).

More Preferably, a ratio of the all optical path distance DOAX and the object-to-image distance DRW satisfies the following conditional expression.

$$0.3<DRW/DOAX<0.50 \quad (15)$$

The optical system that has the shorten object-to-image distance for the optical system with a higher NA and the superior optical performance can be achieved by satisfying the conditional expression 15.

The first deflective reflector FM1 and the second deflective reflector FM2 are, for example, a deflective mirror. It does not matter whether the shape of the mirror is a flat shape or other shape. The first deflective reflector FM1 and the second deflective reflector FM2 may be a mirror using reflections on a rear surface of the glass.

An aperture stop (not shown) may be arranged in the lens group L3. However, the aperture stop may be arranged in the lens group L1 or near the concave mirror M in the lens group L2. Plural aperture stops may be arranged.

Preferably, the catadioptric projection optical system 100 made telecentric in at least the image-surface side for reduced changes in magnification when the surface of the second object 102 fluctuates in the optical-axis direction. More preferably, the object-surface side made telecentric.

The catadioptric projection optical system 100 may include an aberration correction mechanism. The aberration correction mechanism may have a (lens decentering) mechanism in the first lens group L1 that moves a lens in the optical-axis direction and/or in a direction perpendicular to the optical axis or in other directions. A similar mechanism is also applicable to the catadioptric group L2 and lens group L3. A mechanism that transforms the concave mirror M may be provided to correct aberrations.

The catadioptric projection optical system 100 is the immersion structure that fills the space with the fluid WT between the second object 102 and the final lens surface of the optical system in the instant embodiment. The catadioptric projection optical system 100 is not limited to the immersion structure, and the space between the second object 102 and the final lens surface of the optical system may be gas. If the space between the second object 102 and the final lens surface of the optical system is gas, the numerical aperture NA in the image side is smaller than 1.

In the catadioptric projection optical system 100, a field stop may be provided near the first intermediate image IMG1 or the second intermediate image IMG2. A field stop may also be provided near the surface of the second object 102. When the catadioptric projection optical system 100 uses the immersion structure, and a diffraction optical element is used for the catadioptric projection optical system 100, a view-field limiting stop is provided the final lens surface of the optical system or a field stop is provided a neighboring. Thereby, a flare and ghost can be more effectively prevented.

In building the immersion optical system such as the catadioptric projection optical system of the instant embodiment, whether or not the diffraction optical element is present, an axial interval between the final lens surface of the optical system and the surface of the second object 102 is preferably 5 mm or less to minimize influences by fluid WT properties etc. on the imaging performance of the optical system. If the fluid WT does not influence the optical performance of the optical system, it is not limited to that.

The catadioptric projection optical system 100 of the present invention is suitable for the exposure apparatus that uses a light with shorten wavelength, preferably a light with a wavelength of 200 nm or less, as exposure light, and is especially effective for the wavelength such as ArF excimer laser and $F_2$ laser that requires for to the immersion. Preferably, the paraxial axis magnification of the entire system of the catadioptric projection optical system 100 is the reduction system. Especially, the magnification β may use within a range of about $1/10 \leq |\beta| \leq 1/3$.

Hereafter, a description will now be given of a specific lens formation of the catadioptric projection optical system 100 of the present invention.

First Embodiment

Figure 9:
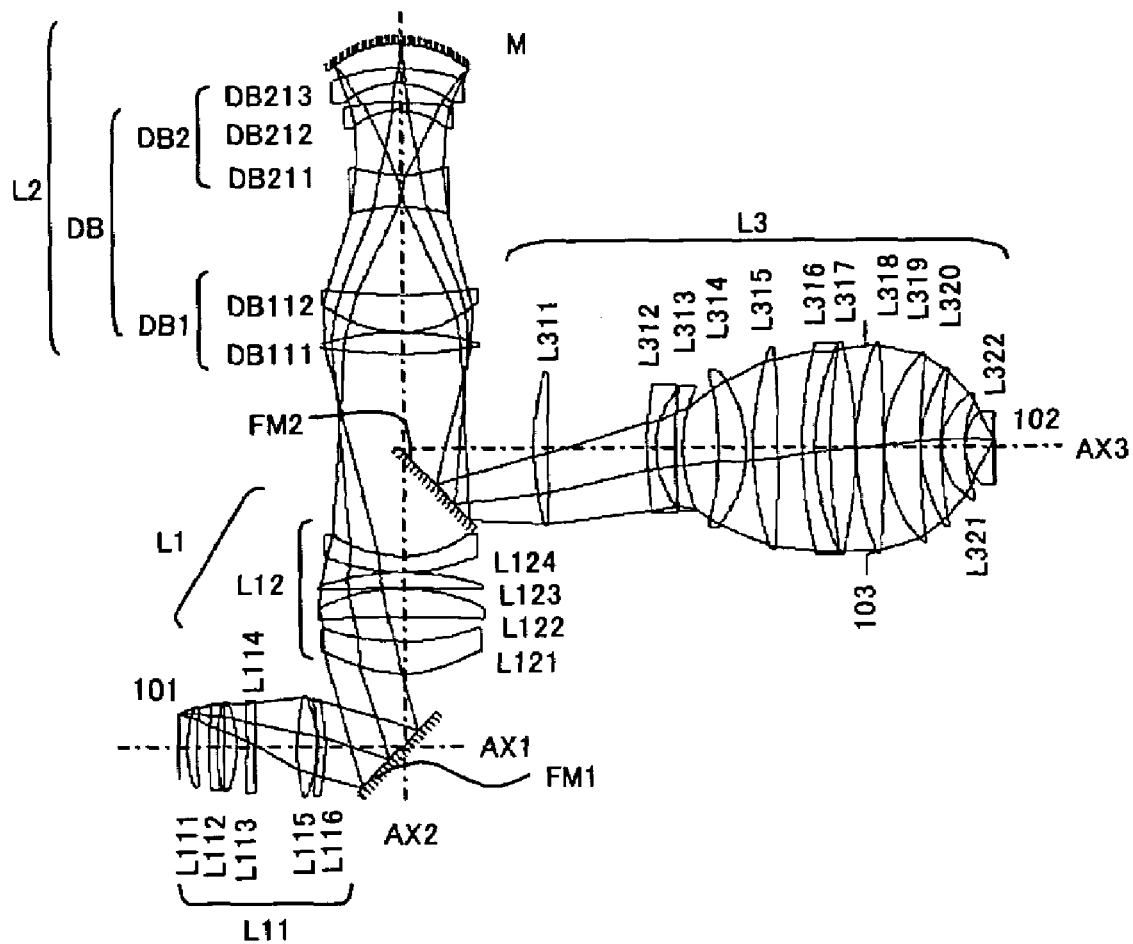
FIG. 9 is an optical-path diagram showing a specific lens formation of the catadioptric projection optical system according to the present invention.

FIG. 9 is an optical-path diagram showing a specific lens formation of the catadioptric projection optical system 100 of the first embodiment. Referring to FIG. 9, the catadioptric projection optical system 100 includes, in order from the first object 101 side, a lens group (a first dioptric group) L1 that does not form a reciprocating optical system (double-pass optical system), a catadioptric group L2 that forms the reciprocating optical system (double-pass optical system), and a lens group (a second dioptric group) L3 that does not form the reciprocating optical system (double-pass optical system).

The lens group L1 includes a lens group (a first lens group) L11 having a positive refractive power and a lens group (a second lens group) L12 having a positive refractive power. The catadioptric group L2 includes a lens group (a third lens group) DB that forms the reciprocating optical system (double-pass optical system) and a concave mirror M. The lens group DB that forms the reciprocating optical system (double-pass optical system) includes a lens group (a fourth lens group) DB1 having a positive refractive power and a lens group (a fifth lens group) DB2 having a negative refractive power.

The catadioptric projection optical system 100 includes two deflective reflectors (a first deflective reflector and a second deflective reflector) FM1 and FM2, other deflective reflector is arranged between the lens group L11 and the lens group L12, and the other deflective reflector is arranged between the lens group L3 and the concave mirror M.

The first deflective reflector FM1 is arranged between the lens group L11 and the lens group L12, and deflects the optical axis AX1 to the optical axis AX2 by 90 degrees. As a result, a light is deflected. A light from the object point in off-axis of the first object 101 enters the first deflective reflector FM1 while some converging, and is reflected by the first deflective reflector FM1.

The second deflective reflector FM2 is arranged between the lens group L3 and the lens group DB1, and deflects the optical axis AX2 to the optical axis AX3 by 90 degrees. As a result, a light is deflected.

The first deflective reflector FM1 and the second deflective reflector FM2 are a plane mirror in the instant embodiment. The first intermediate image IMG1 as a real image of the off-axis light exists between the lens group L12 that does not form the reciprocating optical system (double-pass optical system) and the lens group DB1 that forms the reciprocating optical system (double-pass optical system). The intermediate image IMG2 as the real image exists between the lens group DB1 that forms the reciprocating optical system (double-pass optical system) and the lens group L3 that does not form the reciprocating optical system (double-pass optical system), and concretely, exists between the second deflective reflector FM2 and the lens group DB1 that forms the reciprocating optical system (double-pass optical system).

A pupil of the first imaging optical system exists near between an aspheric positive lens L116 described later and the first deflective reflector FM1. A pupil of the third imaging optical system exists near an aperture stop 103. Therefore, neither the pupil of the first imaging optical system nor the pupil of the third imaging optical system are the same. The lens group L11 having a positive refractive power includes, along the light traveling direction from the side of the first object 101, an approximately planoconvex positive lens L111 with its approximately convex surface oriented toward the first object 101 side, a meniscus aspheric negative lens L112 with its convex surface oriented toward the first object 101 side, a positive lens L113 with its approximately flat surface oriented toward the first object 101 side, a biconcave negative lens L114, a biconvex positive lens L115, and a meniscus aspheric positive lens L116 with its concave surface oriented toward the first object 101 side.

The lens group L12 having a positive refractive power includes, in order from the first deflective reflector FM1 side, a meniscus aspheric positive lens L121 with its convex surface oriented toward the first deflective reflector FM1 side, an approximately planoconvex aspheric positive lens L122 with its approximately flat surface oriented toward the first deflective reflector FM1 side, an approximately planoconvex positive lens L113 with its approximately flat surface oriented toward the first deflective reflector FM1 side, and a meniscus negative lens L124 with its concave surface oriented toward the side of the concave mirror M.

The lens group DB1 forming the reciprocating optical system (double-pass optical system) and having the positive refractive power includes, in order from the first deflective reflector FM1 side, a biconvex positive lens DB111, and a meniscus positive lens DB112 with its concave surface oriented toward the side of the concave mirror M.

The lens group DB2 forming the reciprocating optical system (double-pass optical system) and having the negative refractive power includes, in order from the first deflective reflector FM1 side, a biconcave negative lens DB211, an meniscus negative lens DB212 with its concave surface oriented toward the first deflective reflector FM1 side, and an meniscus aspheric negative lens DB213 with its concave surface oriented toward the first deflective reflector FM1 side.

The lens group L3 that does not form the reciprocating optical system (double-pass optical system) includes, an approximately planoconvex aspheric positive lens L311 with its convex surface oriented toward the second deflective reflector FM2 side, two meniscus aspheric negative lenses L312 and L313 with their concave surfaces oriented toward the second object 102 side, a meniscus aspheric positive lens L314 with its concave surface oriented toward the second deflective reflector FM2 side, a biconvex positive lens L315, a meniscus negative lens L316 with its concave surface oriented toward the second object 102 side, biconvex positive lenses L317 and L318, two meniscus aspheric positive lenses L319 and L320 with their concave surfaces oriented toward the second object 102 side, a meniscus positive lens L321 with its concave surface oriented toward the second object 102 side, and an approximately planoconvex aspheric positive lens L322 with its approximately flat surface oriented toward the second object 102 side.

The aperture stop 103 is arranged between the positive lens L317 and the positive lens L318 in the instant embodiment. When the light that enters the first deflective reflector FM1 from one point on the first object 101 is converged light, the maximum incidence angle of the light that enters the first deflective reflector FM1 can be reduced as shown in FIG. 9.

The catadioptric projection optical system 100 of the first embodiment uses a projection magnification of ¼, a reference wavelength of 193 nm, and quartz and calcium fluoride as a lens material. An image-side numerical aperture is NA=1.30. An object-to-image distance (the first object surface to the second object surface) is about L=1598 mm. An aberration-corrected object point in a range of about 2.06 to 15.75 mm secures an off-axis rectangular exposure area of at least 26 mm long and 6.8 mm wide.

FIG. 9 shows a light form one image point of off-axis, actually, the catadioptric projection optical system 100 uses off-axis object point within a range that shifts from the optical axis of the first object 101. In that case, a rectangular slit area that does not include the optical axis or arc-shape slit that does not include the optical axis become the exposure area on the first object and the second object.

Figure 10:
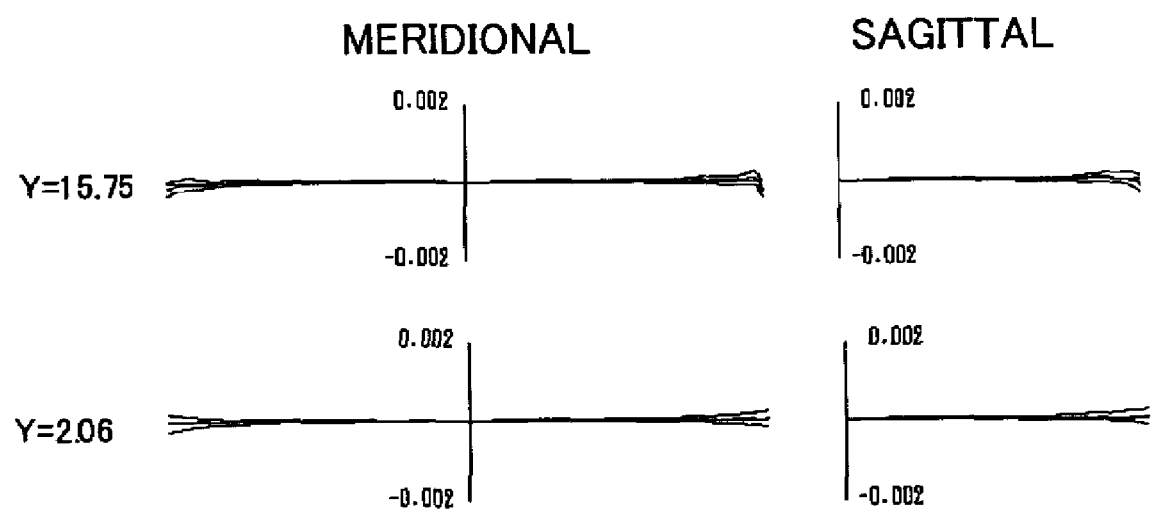
FIG. 10 is an aberrational diagram of the catadioptric projection optical system shown in FIG. 9.

FIG. 10 shows a lateral aberration diagram of the catadioptric projection optical system 100 of the first embodiment. FIG. 10 shows a wavelength with a reference wavelength of 193.0 nm±0.2 pm. Understandably, monochrome and chromatic aberrations are satisfactorily corrected. The used lens material uses only quartz and calcium fluoride in the instant embodiment, and may use other useable lens materials at the same time or singularity.

The following Tables 1 shows the specification of the numerical example of the catadioptric projection optical system 100 of the first embodiment. "i" in the Table 1 is a surface number along a direction of light traveling from the first object 101. "ri" is a radius of curvature for each surface corresponding to a surface number. "di" is a surface spacing of each surface. A lens material SiO$_2$ (quartz) and CaF$_2$ (calcium fluoride), and water as fluid (preferably, pure water) has an index to a reference wavelength λ=193.0 nm are respectively 1.5609, 1.5018 and 1.437, respectively. The refractive indexes of the wavelengths of +0.2 pm and −0.2 pm for the reference wavelength are, 1.56089968 and 1.56090031, respectively for SiO$_2$, 1.50179980 and 1.5018001, respectively for CaF$_2$, 1.43699576 and 1.437000424, respectively for water. A shape of an aspheric surface is given by the following equation.

$$X=(H^2/4)/(1+((1-(1+k)\cdot(H/r)^2))^{1/2})+AH^4+BH^6+CH^8+DH^{10}+EH^{12}+FH^{14}+GH^{16}$$

Here, X is a displacement in a direction of an optical axis from the lens top, H is a distance from the optical axis, ri is a radius of curvature, k is a conical constant, and A, B, C, D, E, F, and G are aspheric coefficients.

TABLE 1

| | | | |
|---|---|---|---|
| L = 1598.38 mm | | | |
| β = ¼ | | | |
| NA = 1.30 | | | |
| \|βL1\| = 1.863 | | | |
| \|βL3\| = 0.133 | | | |
| P1 = 0.0068758 | | | |
| P2 = −0.0158199 | | | |
| P3 = 0.0089438 | | | |
| \|P1 + P2 + P3\| = 2.9e−7 | | | |
| (DRW)/(DOAX) = 0.43 | | | |
| θp = 26.8~42.6 | | | |
| θp2 = 38.9~44.3 | | | |
| \|βL1/β\| = 7.452 | | | |
| \|βL3/NA\| = 0.102 | | | |
| hM/φM = 0.02 | | | |
| DISTANCE FROM FIRST OBJECT~FIRST SURFACE: 17.39934 mm | | | |

| i | ri | di | LENS MATERIAL |
|---|---|---|---|
| 1 | 229.69894 | 18.83929 | SiO2 |
| 2 | 2679.29165 | 23.1499 | |
| 3 | 747.63368 | 15 | SiO2 |

TABLE 1-continued

| | | | |
|---|---|---|---|
| 4 | 499.01659 | 14.62844 | |
| 5 | −3463.38356 | 23.17983 | SiO2 |
| 6 | −208.73537 | 20.20822 | |
| 7 | −1744.21107 | 15.80614 | SiO2 |
| 8 | 1779.67191 | 81.09342 | |
| 9 | 381.69208 | 37.95242 | SiO2 |
| 10 | −228.37189 | 1 | |
| 11 | −458.56815 | 15 | SiO2 |
| 12 | −359.39741 | 149.99811 | |
| 13 | 0 | −136.42522 | FM1 |
| 14 | −236.93883 | −60 | SiO2 |
| 15 | −459.36341 | −44.87073 | |
| 16 | −4783.29410 | −55.00585 | SiO2 |
| 17 | 369.85475 | −1 | |
| 18 | 3864.33104 | −28.86428 | SiO2 |
| 19 | 524.85527 | −1 | |
| 20 | −403.06373 | −29.50615 | SiO2 |
| 21 | −236.37087 | −381.20507 | |
| 22 | −879.28378 | −39.76947 | SiO2 |
| 23 | 575.49553 | −1 | |
| 24 | −242.22061 | −70 | SiO2 |
| 25 | −1074.46918 | −164.11305 | |
| 26 | 382.13196 | −60 | SiO2 |
| 27 | −286.62964 | −120.85874 | |
| 28 | 140.79444 | −15 | SiO2 |
| 29 | 614.54936 | −35.71692 | |
| 30 | 160.03634 | −26.59829 | SiO2 |
| 31 | 394.24498 | −46.59498 | |
| 32 | 217.55001 | 46.59498 | M1 |
| 33 | 394.24498 | 26.59829 | SiO2 |
| 34 | 160.03634 | 35.71692 | |
| 35 | 614.54936 | 15 | SiO2 |
| 36 | 140.79444 | 120.85874 | |
| 37 | −286.62964 | 60 | SiO2 |
| 38 | 382.13196 | 164.11305 | |
| 39 | −1074.46918 | 70 | SiO2 |
| 40 | −242.22061 | 1 | |
| 41 | 575.49553 | 39.76947 | SiO2 |
| 42 | −879.28378 | 180 | |
| 43 | 0 | −261.72663 | FM2 |
| 44 | −461.90233 | −29.46638 | SiO2 |
| 45 | 6349.77698 | −195.40594 | |
| 46 | −598.10410 | −17 | SiO2 |
| 47 | −171.27054 | −37.36744 | |
| 48 | −1128.01288 | −15 | SiO2 |
| 49 | −309.35820 | −69.69403 | |
| 50 | 555.65788 | −53.08357 | SiO2 |
| 51 | 227.69976 | −13.83198 | |
| 52 | −556.10796 | −48.02208 | SiO2 |
| 53 | 2532.61368 | −47.12771 | |
| 54 | −767.00828 | −25 | SiO2 |
| 55 | −450.20561 | −28.84822 | |
| 56 | −1040.85857 | −49.99231 | SiO2 |
| 57 | 781.19567 | −1 | |
| 58 | −503.04425 | −54.67054 | SiO2 |
| 59 | 2546.23830 | 36.53877 | |
| 60 | 0 | −37.53877 | APERTURE STOP |
| 61 | −238.44833 | −71.40477 | SiO2 |
| 62 | −1352.31662 | −1 | |
| 63 | −225.31765 | −40.3288 | SiO2 |
| 64 | −712.92383 | −1 | |
| 65 | −113.96613 | −45.86818 | SiO2 |
| 66 | −219.55405 | −1 | |
| 67 | −94.10665 | −54.64052 | CaF2 |
| 68 | 0 | −1.64877 | WATER |

ASPHERICAL SURFACES

| i | K | A | B | C |
|---|---|---|---|---|
| 4 | 0.000000E+00 | 8.972231E−08 | −1.049362E−12 | 6.269157E−17 |
| 12 | 0.000000E+00 | 1.073379E−08 | 1.200580E−12 | −6.051162E−17 |
| 14 | 0.000000E+00 | 2.079426E−08 | 2.110228E−14 | 4.941353E−18 |
| 16 | 0.000000E+00 | 1.346503E−08 | −2.692097E−13 | 4.742268E−19 |
| 30 | −2.557781E−01 | −1.141630E−08 | −6.775367E−13 | −3.146368E−17 |
| 34 | −2.557781E−01 | −1.141630E−08 | −6.775367E−13 | −3.146368E−17 |
| 44 | 0.000000E+00 | 3.304491E−09 | 8.658085E−14 | −1.645015E−19 |
| 46 | 0.000000E+00 | 2.179431E−08 | −1.182580E−12 | −1.060061E−17 |
| 49 | 0.000000E+00 | −4.123619E−09 | −1.169043E−12 | −1.252695E−17 |

TABLE 1-continued

| | | | | |
|---|---|---|---|---|
| 50 | 0.000000E+00 | 1.130771E−08 | −2.352402E−13 | −1.956252E−18 |
| 61 | −4.649348E−02 | 3.618488E−09 | −4.645024E−14 | −9.679902E−19 |
| 63 | 0.000000E+00 | −3.314136E−09 | 9.374704E−13 | −7.157848E−18 |

| i | D | E | F | G |
|---|---|---|---|---|
| 4 | −4.568584E−20 | 1.277456E−23 | −1.645674E−27 | 7.950897E−32 |
| 12 | 2.985990E−20 | −3.150438E−24 | 4.035534E−28 | −2.055988E−32 |
| 14 | 8.957224E−23 | −2.689992E−27 | 2.163928E−31 | −2.979364E−36 |
| 16 | −1.709546E−22 | 7.058482E−27 | −3.702037E−31 | 6.106527E−36 |
| 30 | 1.149003E−21 | −3.030022E−25 | 2.313370E−29 | −6.143792E−34 |
| 34 | 1.149003E−21 | −3.030022E−25 | 2.313370E−29 | −6.143792E−34 |
| 44 | 3.554655E−23 | −3.275208E−27 | 1.186943E−31 | −1.371534E−36 |
| 46 | 2.639467E−22 | 1.924568E−25 | −1.572527E−29 | 3.704429E−34 |
| 49 | 1.246511E−21 | −2.539552E−26 | 1.077896E−29 | −3.392444E−34 |
| 50 | −3.370327E−22 | 2.799538E−26 | −1.199198E−30 | 4.405074E−35 |
| 61 | 3.777861E−23 | −1.006665E−27 | 1.852134E−32 | −3.000635E−37 |
| 63 | 6.487931E−22 | −2.597784E−26 | 6.095456E−31 | −6.790502E−36 |

Second Embodiment

Figure 11:
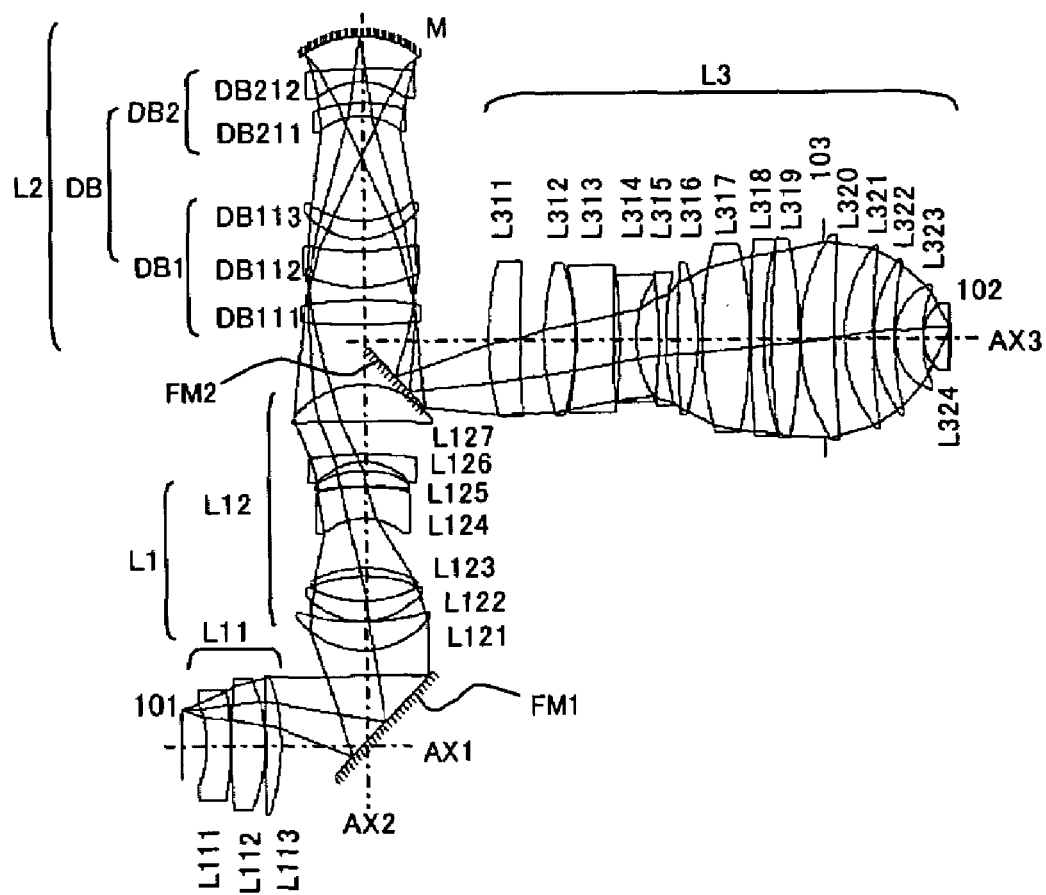
FIG. 11 is an optical-path diagram showing a specific lens formation of the catadioptric projection optical system according to the present invention.

FIG. 11 is an optical-path diagram showing a specific lens formation of the catadioptric projection optical system 100 of the second embodiment. Referring to FIG. 11, the catadioptric projection optical system 100 includes, in order from the first object 101 side, a lens group (a first dioptric group) L1 that does not form a reciprocating optical system (double-pass optical system), a catadioptric group L2 that forms the reciprocating optical system (double-pass optical system), and a lens group (a second dioptric group) L3 that does not form the reciprocating optical system (double-pass optical system).

The lens group L1 includes a lens group (a first lens group) L11 having a positive refractive power and a lens group (a second lens group) L12 having a positive refractive power. The catadioptric group L2 includes a lens group (a third lens group) DB that forms the reciprocating optical system (double-pass optical system) and a concave mirror M. The lens group DB that forms the reciprocating optical system (double-pass optical system) includes a lens group (a fourth lens group) DB1 having a positive refractive power and a lens group (a fifth lens group) DB2 having a negative refractive power.

The catadioptric projection optical system 100 includes two deflective reflectors (a first deflective reflector and a second deflective reflector) FM1 and FM2, other deflective reflector is arranged between the lens group L11 and the lens group L12, and the other deflective reflector is arranged between the lens group L3 and the concave mirror M.

The first deflective reflector FM1 is arranged between the lens group L11 and the lens group L12, and deflects the optical axis AX1 to the optical axis AX2 by 90 degrees. As a result, a light is deflected. A light from the object point in off-axis of the first object 101 enters the first deflective reflector FM1 as a divergent light, and is reflected by the first deflective reflector FM1.

The second deflective reflector FM2 is arranged between the lens group L3 and the lens group DB1, and deflects the optical axis-AX2 to the optical axis AX3 by 90 degrees. As a result, a light is deflected.

The first deflective reflector FM1 and the second deflective reflector FM2 are a plane mirror in the instant embodiment. The first intermediate image IMG1 and the second intermediate image IMG2 of off-axis light exists in the lens group DB1 that forms the reciprocating optical system (double-pass optical system).

A pupil of the first imaging optical system exists near between an aspheric positive lens L122 described later and an aspheric positive lens L123. A pupil of the third imaging optical system exists near an aperture stop 103. Therefore, neither the pupil of the first imaging optical system nor the pupil of the third imaging optical system are the same.

The lens group L11 having a positive refractive power includes, along the light traveling direction from the side of the first object 101, a meniscus aspheric negative lens L111 with its concave surface oriented toward the first object 101 side, a biconvex positive lens L112, and an approximately planoconvex aspheric positive lens L113 with its approximately plane surface oriented toward the first object 101 side.

The lens group L12 having a positive refractive power includes, in order from the first deflective reflector FM1 side, a meniscus positive lens L121 with its convex surface oriented toward the first deflective reflector FM1 side, a meniscus aspheric positive lens L122 with its convex surface oriented toward the first deflective reflector FM1 side, a meniscus aspheric positive lens L123 with its convex surface oriented toward the side of the concave mirror M, a meniscus negative lens L124 with its concave surface oriented toward the first deflective reflector FM1 side, a meniscus positive lens L125 with its convex surface oriented toward the side of the concave mirror M, a meniscus aspheric negative lens L126 with its concave surface oriented toward the first deflective reflector FM1 side, and an approximately planoconvex positive lens L127 with its convex surface oriented toward the side of the concave mirror M.

The lens group DB1 forming the reciprocating optical system (double-pass optical system) and having the positive refractive power includes, in order from the first deflective reflector FM1 side, a biconvex positive lens DB111, and two meniscus positive lenses DB112 and DB113 with their concave surfaces oriented toward the side of the concave mirror M.

The lens group DB2 forming the reciprocating optical system (double-pass optical system) and having the negative refractive power includes, in order from the first deflective reflector FM1 side, a meniscus negative lens DB211 with its concave surface oriented toward the first deflective reflector FM1 side, and a meniscus aspheric negative lens DB212 with its concave surface oriented toward the first deflective reflector FM1 side.

The lens group L3 that does not form the reciprocating optical system (double-pass optical system) includes, an approximately planoconvex positive lens L311 with its convex surface oriented toward the second deflective reflector FM2 side, biconvex positive lens L312, an approximately planoconcave aspheric negative lens L314 with its concave surface oriented toward the second object 102 side, biconcave aspheric negative lens L315, two biconvex aspheric positive lenses L316 and L317, a negative lens L318 with its concave surface oriented toward the second object 102 side, a biconvex positive lens L319, two meniscus positive lenses L320 and L321 with their convex surfaces oriented toward the second deflective reflector FM2 side, two meniscus aspheric positive lenses L322 and L323 with their concave surfaces oriented toward the second object 102 side, and a planoconvex aspheric positive lens L324 with its convex surface oriented toward the second object 102 side.

When the light from one point on the first object 101 to the first deflective reflector FM1 is the divergent light, the first deflective reflector FM1 can be arranged at a position near the first object 101 compared with when the light is the converged light. Therefore, the distance between the first object 101 and the optical axis AX2 can be shortened, and the distance between the first object 101 and the second object 102 can be shortened.

The catadioptric projection optical system 100 of the second embodiment uses a projection magnification of ¼, a reference wavelength of 193 nm, and quartz and calcium fluoride as a lens material. An image-side numerical aperture is NA=1.30. An object-to-image distance (the first object surface to the second object surface) is about L=1597 mm. An aberration-corrected object point in a range of about 3.75 to 17.0 mm secures an off-axis rectangular exposure area of at least 26 mm long and 7.2 mm wide. However, the exposure area is not limited to the rectangular, for example, may be arc-shape.

Figure 12:
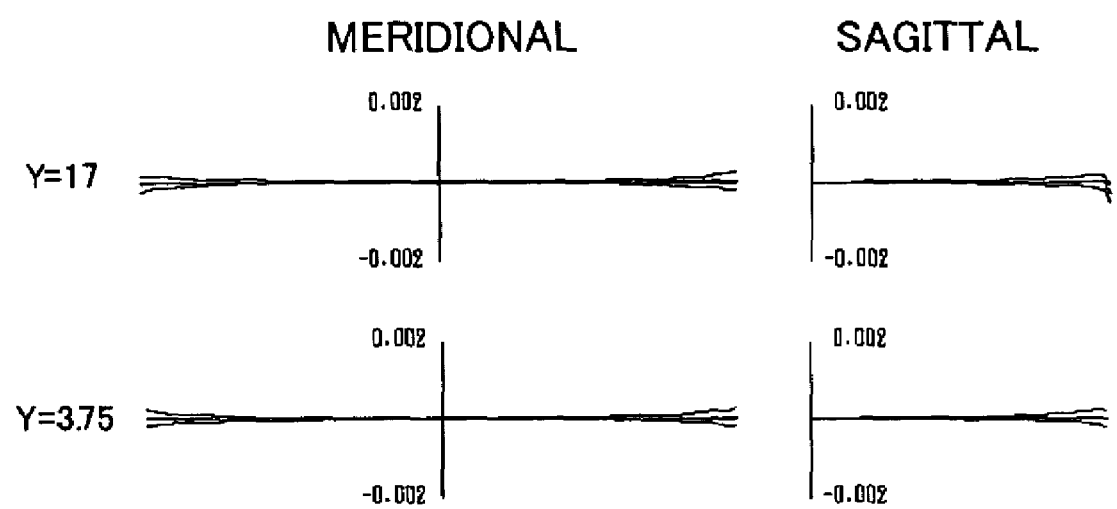
FIG. 12 is an aberrational diagram of the catadioptric projection optical system shown in FIG. 11.

FIG. 12 shows a lateral aberration diagram of the catadioptric projection optical system 100 of the second embodiment. FIG. 12 shows a wavelength with a reference wavelength of 193.0 nm±0.2 pm. Understandably, monochrome and chromatic aberrations are satisfactorily corrected.

The following Tables 2 shows the specification of the numerical example of the catadioptric projection optical system 100 of the second embodiment. Each character in Table 2 etc. are the same as the definition of Table 1.

TABLE 2

L = 1597.39 mm
$\beta$ = ¼
NA = 1.30
$|\beta L1|$ = 1.625
$|\beta L3|$ = 0.159
P1 = 0.0033067
P2 = −0.0131784
P3 = 0.0098719
$|P1 + P2 + P3|$ = 1.7e−7
(DRW)/(DOAX) = 0.45
$\theta p$ = 35.6~42.8
$\theta p2$ = 40.5~44.0
$|\beta L1/\beta|$ = 6.499
$|\beta L3/NA|$ = 0.123
$hM/\phi M$ = 0.004
DISTANCE FROM FIRST OBJECT~FIRST SURFACE: 52.56298 mm

| i | ri | di | LENS MATERIAL | |
|---|---|---|---|---|
| 1 | −197.26337 | 47.66494 | SiO2 | |
| 2 | −559.21722 | 1 | | |
| 3 | 1452.70921 | 70 | SiO2 | |
| 4 | −296.96878 | 1 | | |
| 5 | −12196.06482 | 31.75484 | SiO2 | |
| 6 | −383.06710 | 170 | | |
| 7 | 0.00000 | −180 | | FM1 |
| 8 | −180.10417 | −54.73525 | | |
| 9 | −470.40511 | −1 | SiO2 | |
| 10 | −161.96016 | −39.0403 | | |
| 11 | −307.21831 | −46.32692 | SiO2 | |
| 12 | 382.31114 | −16.33563 | | |
| 13 | 242 | −94.86107 | SiO2 | |
| 14 | 131.96088 | −60.925 | | |
| 15 | 473.07725 | −1 | SiO2 | |
| 16 | 710.04000 | −32.98255 | | |
| 17 | 166.55976 | −16.98966 | SiO2 | |
| 18 | 122.83736 | −15 | | |
| 19 | 478.71154 | −62.51265 | SiO2 | |
| 20 | 3117.10979 | −70.23112 | | |
| 21 | 189.45802 | −113.55876 | | |
| 22 | −988.73711 | −47.58179 | SiO2 | |
| 23 | 759.74527 | −24.71504 | | |
| 24 | −283.77906 | −68.96334 | SiO2 | |
| 25 | −568.32227 | −23.25286 | | |
| 26 | −152.73736 | −34.63814 | SiO2 | |
| 27 | −182.86234 | −199.23403 | | |
| 28 | 135.29625 | −25 | SiO2 | |

TABLE 2-continued

| | | | | |
|---|---|---|---|---|
| 29 | 302.06691 | −40 | | |
| 30 | 137.98946 | −25 | SiO2 | |
| 31 | 1056.97578 | −61.29499 | | |
| 32 | 212.01520 | 61.29499 | | M1 |
| 33 | 1056.97578 | 25 | SiO2 | |
| 34 | 137.98946 | 40 | | |
| 35 | 302.06691 | 25 | SiO2 | |
| 36 | 135.29625 | 199.23403 | | |
| 37 | −182.86234 | 34.63814 | SiO2 | |
| 38 | −152.73736 | 23.25286 | | |
| 39 | −568.32227 | 68.96334 | SiO2 | |
| 40 | −283.77906 | 24.71504 | | |
| 41 | 759.74527 | 47.58179 | SiO2 | |
| 42 | −988.73711 | 28 | | |
| 43 | 0 | −263.4995 | | FM2 |
| 44 | −508.44245 | −64.67718 | SiO2 | |
| 45 | −1503.56130 | −51.26965 | | |
| 46 | −439.98345 | −66.82885 | SiO2 | |
| 47 | 456.54199 | −1 | | |
| 48 | 583.63498 | −81.27307 | SiO2 | |
| 49 | −8799.14152 | −9.70349 | | |
| 50 | 31868.11647 | −34.39264 | SiO2 | |
| 51 | −181.39902 | −47.61182 | | |
| 52 | 1062.77926 | −15 | SiO2 | |
| 53 | −509.66686 | −24.63368 | | |
| 54 | −1438.24484 | −41.96694 | SiO2 | |
| 55 | 483.26698 | −9.04601 | | |
| 56 | −632.06837 | −98.28458 | SiO2 | |
| 57 | 764.03627 | −2.17009 | | |
| 58 | −2122.05207 | −26.24199 | SiO2 | |
| 59 | −633.83388 | −15.68514 | | |
| 60 | −1317 | −59.19645 | | |
| 61 | 871.11584 | −49.63016 | SiO2 | |
| 62 | 0.00000 | 48.63016 | | APERTURE STOP |
| 63 | −333.35927 | −70 | SiO2 | |
| 64 | −2029.33621 | −20.00491 | | |
| 65 | −268.06642 | −59.96658 | SiO2 | |
| 66 | −1261.02463 | −1.03346 | | |
| 67 | −211.42730 | −43.24588 | SiO2 | |
| 68 | −551 | −1 | | |
| 69 | −105.29385 | −58.32458 | SiO2 | |
| 70 | −249.29128 | −1.05564 | | |
| 71 | −79.61044 | −53.08344 | CaF2 | |
| 72 | 0 | −2.21551 | WATER | |

ASPHERICAL SURFACES

| i | K | A | B | C |
|---|---|---|---|---|
| 1 | 0.000000E+00 | −1.983122E−08 | −1.371981E−12 | −7.671362E−17 |
| 11 | 0.000000E+00 | −4.777763E−08 | 1.351028E−13 | −1.859322E−17 |
| 12 | 0.000000E+00 | 1.475901E−08 | 9.131524E−13 | −1.558836E−17 |
| 19 | 0.000000E+00 | −4.189854E−08 | −7.169197E−13 | 9.796481E−18 |
| 30 | −3.662549E−01 | −1.508664E−08 | −1.171288E−12 | −4.152376E−17 |
| 34 | −3.662549E−01 | −1.508664E−08 | −1.171288E−12 | −4.152376E−17 |
| 50 | 0.000000E+00 | 3.549867E−08 | −5.658246E−13 | −1.311187E−17 |
| 53 | 0.000000E+00 | 6.926817E−09 | −6.163660E−13 | −4.984976E−18 |
| 54 | 0.000000E+00 | 1.158067E−09 | −5.628462E−14 | 1.803959E−18 |
| 56 | 0.000000E+00 | 5.190326E−10 | 2.612087E−14 | −4.068665E−19 |
| 67 | 0.000000E+00 | 3.793915E−09 | 5.069221E−13 | −5.442352E−18 |
| 70 | 0.000000E+00 | −5.909576E−08 | −7.152713E−13 | −1.621541E−16 |
| 71 | 0.000000E+00 | −2.965114E−09 | −2.354683E−12 | −3.919420E−16 |

| i | D | E | F | G |
|---|---|---|---|---|
| 1 | −6.222798E−21 | −3.774651E−25 | 3.657001E−29 | −8.092789E−33 |
| 11 | −1.200672E−22 | −3.234284E−26 | 9.439719E−31 | −8.259453E−35 |
| 12 | 5.908754E−22 | −1.624166E−25 | 8.396153E−30 | −1.210122E−34 |
| 19 | 7.713163E−22 | 3.421702E−26 | −4.040191E−30 | 9.179794E−35 |
| 30 | 1.361822E−21 | −6.162287E−25 | 6.374789E−29 | −2.670468E−33 |
| 34 | 1.361822E−21 | −6.162287E−25 | 6.374789E−29 | −2.670468E−33 |
| 50 | 1.208137E−21 | 1.250887E−26 | −9.206401E−31 | 7.507140E−37 |
| 53 | 9.057914E−22 | 1.823111E−26 | −3.008696E−30 | 2.932755E−35 |
| 54 | 4.712823E−22 | 2.368849E−26 | −1.742331E−30 | 3.825258E−35 |
| 56 | −5.487041E−23 | 2.386936E−28 | 4.452436E−32 | −6.329520E−37 |

TABLE 2-continued

| 67 | 1.080797E−22 | −2.488998E−27 | 7.196976E−31 | −1.238850E−35 |
| 70 | 3.483055E−20 | −4.023171E−24 | 2.975590E−28 | −9.140246E−33 |
| 71 | −1.418010E−19 | 1.29942E−23 | −2.30895E−27 | −9.50448E−31 |

Third Embodiment

Figure 13:
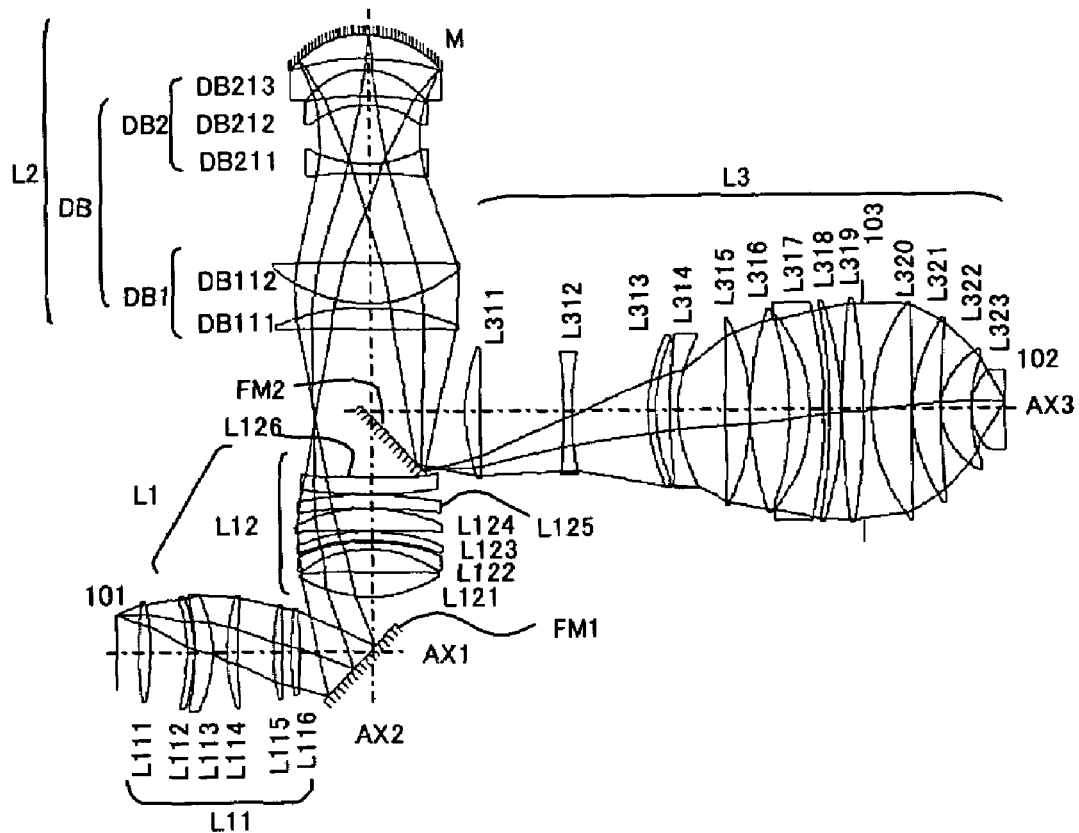
FIG. 13 is an optical-path diagram showing a specific lens formation of the catadioptric projection optical system according to the present invention.

FIG. 13 is an optical-path diagram showing a specific lens formation of the catadioptric projection optical system 100 of the first embodiment. Referring to FIG. 13, the catadioptric projection optical system 100 includes, in order from the first object 101 side, a lens group (a first dioptric group) L1 that does not form a reciprocating optical system (double-pass optical system), a catadioptric group L2 that forms the reciprocating optical system (double-pass optical system), and a lens group (a second dioptric group) L3 that does not form the reciprocating optical system (double-pass optical system).

The lens group L1 includes a lens group (a first lens group) L11 having a positive refractive power and a lens group (a second lens group) L12 having a positive refractive power. The catadioptric group L2 includes a lens group (a third lens group) DB that forms the reciprocating optical system (double-pass optical system) and a concave mirror M. The lens group DB that forms the reciprocating optical system (double-pass optical system) includes a lens group (a fourth lens group) DB1 having a positive refractive power and a lens group (a fifth lens group) DB2 having a negative refractive power.

The catadioptric projection optical system 100 includes two deflective reflectors (a first deflective reflector and a second deflective reflector) FM1 and FM2, other deflective reflector is arranged between the lens group L11 and the lens group L12, and the other deflective reflector is arranged between the lens group L3 and the concave mirror M.

The first deflective reflector FM1 is arranged between the lens group L11 and the lens group L12, and deflects the optical axis AX1 to the optical axis AX2 by 90 degrees. As a result, a light is deflected. A light from the object point in off-axis of the first object 101 enters the first deflective reflector FM1 as the converged light, and is reflected by the first deflective reflector FM1.

The second deflective reflector FM2 is arranged between the lens group L3 and the lens group DB1, and deflects the optical axis AX2 to the optical axis AX3 by 90 degrees. As a result, a light is deflected.

The first deflective reflector FM1 and the second deflective reflector FM2 are a plane mirror in the instant embodiment. The first intermediate image IMG1 as a real image of the off-axis light exists between the lens group L12 that does not form the reciprocating optical system (double-pass optical system) and the lens group DB1 that forms the reciprocating optical system (double-pass optical system). The intermediate image IMG2 as the real image exists between the lens group DB1 that forms the reciprocating optical system (double-pass optical system) and the lens group L3 that does not form the reciprocating optical system (double-pass optical system), and concretely, exists between the second deflective reflector FM2 and the lens group L3 that does not form the reciprocating optical system (double-pass optical system).

A pupil of the first imaging optical system exists near between an aspheric positive lens L116 described later and the first deflective reflector FM1. A pupil of the third imaging optical system exists near an aperture stop 103. Therefore, neither the pupil of the first imaging optical system nor the pupil of the third imaging optical system are the same.

The lens group L11 having a positive refractive power includes, along the light traveling direction from the side of the first object 101, a biconvex positive lens L111, a meniscus aspheric positive lens L112 with its concave surface oriented toward the first object 101 side, a meniscus positive lens L113 with its concave surface oriented toward the first object 101 side, a meniscus positive lens L114 with its convex surface oriented toward the first object 101 side, an approximately planoconvex positive lens L115 with its convex surface oriented toward the first object 101 side, and a biconvex aspheric positive lens L116.

The lens group L12 having a positive refractive power includes, in order from the first deflective reflector FM1 side, an approximately planoconvex aspheric positive lens L121 with its convex surface oriented toward the first deflective reflector FM1 side, a meniscus aspheric negative lens L122 with its concave surface oriented toward the first deflective reflector FM1 side, a meniscus positive lens L123 with its concave surface oriented toward the first deflective reflector FM1 side, an approximately planoconvex positive lens L124 with its convex surface oriented toward the side of the concave mirror M, a meniscus positive lens L125 with its convex surface oriented toward the side of the concave mirror M, and an aspheric positive lens L126 with its convex surface oriented toward the first deflective reflector FM1 side.

The lens group DB1 forming the reciprocating optical system (double-pass optical system) and having the positive refractive power includes, in order from the first deflective reflector FM1 side, an approximately planoconvex positive lens DB111 with its convex surface oriented toward the side of the concave mirror M, and an approximately planoconvex positive lens DB112 with its approximately plane surface oriented toward the side of the concave mirror M.

The lens group DB2 forming the reciprocating optical system (double-pass optical system) and having the negative refractive power includes, in order from the first deflective reflector FM1 side, a biconcave negative lens DB211, an meniscus negative lens DB212 with its concave surface oriented toward the first deflective reflector FM1 side, and an meniscus aspheric negative lens DB213 with its concave surface oriented toward the first deflective reflector FM1 side.

The lens group L3 that does not form the reciprocating optical system (double-pass optical system) includes an approximately planoconvex positive lens L311 with its convex surface oriented toward the second deflective reflector FM2 side, an aspheric negative lens L312 with its concave surface oriented toward the second object 102 side, a meniscus aspheric positive lens L313 with its concave surface oriented toward the second object 102 side, a meniscus aspheric negative lens L314 with its concave surface oriented toward the second object 102 side, an approximately planoconvex aspheric positive lens L315 with its convex surface oriented toward the second object 102 side, biconvex positive lens L316, a meniscus negative lens L317 with its concave surface oriented toward the second deflective reflector FM2 side, a meniscus positive lens L318 with its concave surface oriented toward the second deflective reflector FM2 side, a biconvex aspheric positive lens L319, a planoconvex positive lens L320 with its convex surface oriented toward the second deflective reflector FM2 side, two meniscus aspheric positive lenses L321 and L322 with their concave surfaces oriented toward the second object 102 side, a planoconvex positive lens L323 with its convex surface oriented toward the second deflective reflector FM2 side.

The aperture stop 103 is arranged between the aspheric positive lens L319 and the positive lens L320 in the instant embodiment.

The catadioptric projection optical system 100 of the third embodiment uses a projection magnification of ¼, a reference wavelength of 193 nm, and only calcium fluoride as a lens material. An image-side numerical aperture is NA=1.31. An object-to-image distance (the first object surface to the second object surface) is about L=1654 mm. An aberration-corrected object point in a range of about 3.5 to 16.25 mm secures an off-axis rectangular exposure area of at least 26 mm long and 6.2 mm wide. However, the exposure area is not limited to the rectangular, for example, may be arc-shape.

Figure 14:
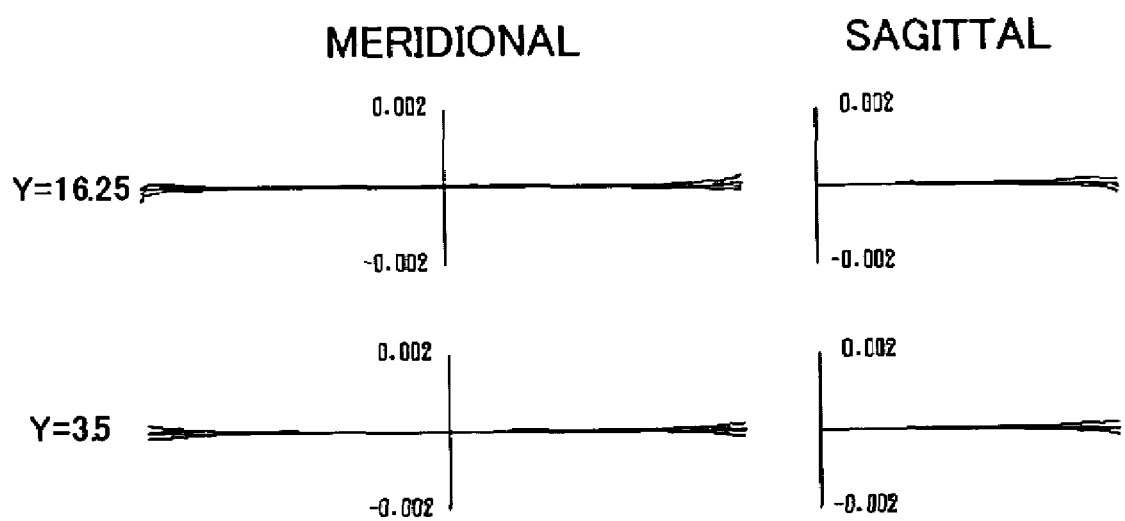
FIG. 14 is an aberrational diagram of the catadioptric projection optical system shown in FIG. 13.

FIG. 14 shows a lateral aberration diagram of the catadioptric projection optical system 100 of the third embodiment. FIG. 14 shows a wavelength with a reference wavelength of 193.0 nm±0.2 pm. Understandably, monochrome and chromatic aberrations are satisfactorily corrected.

The following Tables 3 shows the specification of the numerical example of the catadioptric projection optical system 100 of the third embodiment. Each character in Table 3 etc. are the same as the definition of Table 1.

TABLE 3

L = 1653.54 mm
β = ¼
NA = 1.31
|βL1| = 1.486
|βL3| = 0.170
P1 = 0.0076652
P2 = −0.0175967
P3 = 0.0099324
|P1 + P2 + P3| = 1.03e−6
(DRW)/(DOAX) = 0.49
θp = 25.5~40.9
θp2 = 43.4~44.8
|βL1/β| = 5.944
|βL3/NA| = 0.130
hM/φM = 0.028
DISTANCE FROM FIRST OBJECT~FIRST SURFACE: 43.15711 mm

| i | ri | di | LENS MATERIAL |
|---|---|---|---|
| 1 | 571.41549 | 22.18118 | SiO2 |
| 2 | −421.75680 | 67.68034 | |
| 3 | −309.46182 | 14.98141 | SiO2 |
| 4 | −245.77792 | 1.77065 | |
| 5 | −371.52240 | 31.73899 | SiO2 |
| 6 | −210.99066 | 26.97302 | |
| 7 | 268.51340 | 18.93896 | SiO2 |
| 8 | 741.53426 | 66.94427 | |
| 9 | 371.50123 | 15.30687 | SiO2 |
| 10 | 2792.49007 | 17.91646 | |
| 11 | 625.01790 | 14.7824 | SiO2 |
| 12 | −994.20713 | 129.74601 | |
| 13 | 0 | −92.81777 | FM1 |
| 14 | −237.94274 | −42.1391 | |
| 15 | 6133.99391 | −39.75064 | SiO2 |
| 16 | 221.54386 | −12.28 | |
| 17 | 420.03661 | −3.59402 | SiO2 |
| 18 | 370.29117 | −14.7824 | |
| 19 | 373.41125 | −1.00437 | SiO2 |
| 20 | 4972.26653 | −37.56563 | |
| 21 | 338.92582 | −1.02373 | SiO2 |
| 22 | 1095.83749 | −22.91271 | |
| 23 | 729.98907 | −1.00192 | SiO2 |
| 24 | −975.48328 | −30.83926 | |
| 25 | 1761.09661 | −254.42614 | SiO2 |
| 26 | −61989.86151 | −36.27986 | |
| 27 | 485.27566 | −7.31986 | SiO2 |
| 28 | −274.07078 | −69.26867 | |
| 29 | −33858.21710 | −152.90805 | SiO2 |
| 30 | 988.33087 | −15.56161 | |
| 31 | −220.95235 | −100.11414 | SiO2 |
| 32 | 167.20145 | −15.1005 | |
| 33 | 687.59387 | −44.72334 | SiO2 |
| 34 | 129.89652 | −18.89694 | |

TABLE 3-continued

| | | | | |
|---|---|---|---|---|
| 35 | 485.89656 | −40.42551 | SiO2 | |
| 36 | 192.24064 | 40.42551 | | M1 |
| 37 | 485.89656 | 18.89694 | SiO2 | |
| 38 | 129.89652 | 44.72334 | | |
| 39 | 687.59387 | 15.1005 | SiO2 | |
| 40 | 167.20145 | 100.11414 | | |
| 41 | −220.95235 | 15.56161 | SiO2 | |
| 42 | 988.33087 | 152.90805 | | |
| 43 | −33858 | 69.26867 | SiO2 | |
| 44 | −274.07078 | 7.31986 | | |
| 45 | 485.27566 | 36.27986 | SiO2 | |
| 46 | −61989.86151 | 144.44335 | | |
| 47 | 0.00000 | −179.26675 | | FM2 |
| 48 | −291.38664 | −28.75028 | SiO2 | |
| 49 | −8695.26673 | −153.65969 | | |
| 50 | 4304.63961 | −17.00008 | SiO2 | |
| 51 | −594.86394 | −144.76383 | | |
| 52 | −287.65915 | −15.00019 | SiO2 | |
| 53 | −286.43322 | −26.44111 | | |
| 54 | −988.02534 | −14.7824 | SiO2 | |
| 55 | −231.64386 | −89.82366 | | |
| 56 | −2186.26729 | −45.40833 | SiO2 | |
| 57 | 342.09628 | −1 | | |
| 58 | −485.21654 | −72.02828 | SiO2 | |
| 59 | 466.09860 | −37.32422 | | |
| 60 | 251 | −25 | SiO2 | |
| 61 | 791.07423 | −9.72746 | | |
| 62 | 999.27288 | −21.46834 | SiO2 | |
| 63 | 586.16821 | −1.03501 | | |
| 64 | −1080.90614 | −40.091 | SiO2 | |
| 65 | 1095.28503 | −0.58934 | | |
| 66 | 0.00000 | −14.82657 | | APERTURE STOP |
| 67 | −284.85514 | −74.62913 | SiO2 | |
| 68 | −153324 | −1 | | |
| 69 | −252.30001 | −51.72437 | SiO2 | |
| 70 | −1278.06649 | −1 | | |
| 71 | −114.59441 | −53.20571 | SiO2 | |
| 72 | −273.60595 | −1.02021 | | |
| 73 | −96.22524 | −59.99996 | SiO2 | |
| 74 | 0 | −0.86372 | water | |

ASPHERICAL SURFACES

| i | K | A | B | C |
|---|---|---|---|---|
| 4 | 0.000000E+00 | 9.454156E−09 | −4.587549E−13 | −7.883615E−18 |
| 11 | 0.000000E+00 | 1.876479E−08 | −5.285089E−12 | 1.744686E−16 |
| 14 | 0.000000E+00 | 1.017542E−08 | −3.106688E−14 | 3.494066E−18 |
| 17 | 0.000000E+00 | 1.493161E−08 | −4.213530E−15 | −3.807285E−18 |
| 25 | 0.000000E+00 | −3.359542E−08 | −1.187369E−13 | −4.826797E−18 |
| 34 | −2.234011E−01 | −8.510932E−09 | −7.402372E−13 | −4.305980E−17 |
| 38 | −2.234011E−01 | −8.510932E−09 | −7.402372E−13 | −4.305980E−17 |
| 50 | 0.000000E+00 | 3.912083E−08 | −1.880582E−13 | −1.833167E−20 |
| 52 | 0.000000E+00 | −2.613488E−08 | 1.438642E−12 | −2.204581E−17 |
| 55 | 0.000000E+00 | −1.697547E−08 | 1.586132E−12 | −1.011414E−18 |
| 56 | 0.000000E+00 | 4.296657E−09 | 1.800932E−14 | 1.173469E−18 |
| 64 | −1.755057E+00 | 7.825299E−10 | 1.277203E−14 | 1.945377E−19 |
| 69 | 0.000000E+00 | −8.130530E−09 | 6.080470E−13 | −1.851439E−17 |
| 72 | 0.000000E+00 | −4.759357E−08 | −1.347526E−12 | 9.952636E−18 |

| i | D | E | F | G |
|---|---|---|---|---|
| 4 | 3.366752E−21 | −5.250687E−25 | 3.825599E−29 | −1.118940E−33 |
| 11 | 5.751094E−21 | −8.370452E−24 | 2.058997E−27 | −1.512372E−31 |
| 14 | 5.840020E−23 | −1.886714E−26 | 1.005236E−30 | −2.607824E−35 |
| 17 | 8.562685E−23 | −6.693008E−27 | 2.133749E−31 | −3.305598E−36 |
| 25 | 2.726869E−22 | −4.240750E−26 | 2.658104E−30 | −6.992032E−35 |
| 34 | −1.256211E−21 | −1.818010E−25 | 6.806364E−30 | −5.179165E−34 |
| 38 | −1.256211E−21 | −1.818010E−25 | 6.806364E−30 | −5.179165E−34 |
| 50 | −1.310833E−21 | 1.677339E−25 | −9.725442E−30 | 2.188942E−34 |
| 52 | 5.943702E−22 | −3.014533E−26 | 3.798384E−31 | 1.869796E−36 |
| 55 | −5.484916E−22 | −3.878570E−26 | 2.280174E−30 | −4.105628E−35 |
| 56 | −5.906512E−24 | 1.521282E−27 | −3.731779E−32 | 1.120387E−36 |
| 64 | −7.175263E−24 | −3.667498E−28 | 9.888463E−33 | −6.665048E−38 |
| 69 | 2.850804E−22 | 6.90719E−27 | −7.90232E−32 | −7.74775E−37 |
| 72 | 3.18674E−21 | −4.24038E−25 | 5.03261E−29 | −1.87995E−33 |

The catadioptric projection optical system of the present invention can arrange the first object (reticle) and the second object (wafer) in parallel, and can compose an optical system that shortens the object-to-image distance without enlarging the optical system further a higher NA by the immersion. The catadioptric projection optical system of the present invention does not shade the pupil, can obtain an imaging area width with enough size on the image surface, and can stably achieve superior imaging performance.

Figure 15:
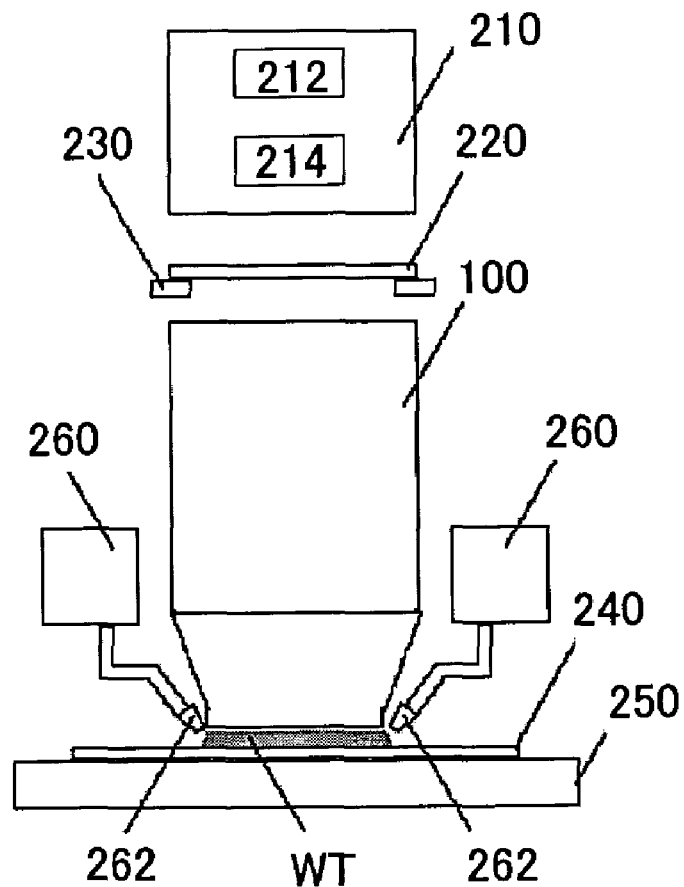
FIG. 15 is a schematic sectional view of an exposure apparatus according to the present invention.

Referring now to FIG. 15, a description will be given of an exposure apparatus 200 to which the catadioptric projection optical system 100 of the present invention is applied. FIG. 15 is a schematic sectional view of an exposure apparatus 200 of one aspect according to the present invention.

The exposure apparatus 200 is an immersion type exposure apparatus that exposes onto an object 240 a circuit pattern created on a reticle 220 via a fluid WT supplied between a final lens surface at the object 240 side of a projection optical system 100 and the object 240 in a step-and-scan manner or step-and-repeat manner. Such an exposure apparatus is suitable for a sub-micron or quarter-micron lithography process. The instant embodiment exemplarily describes a step-and-scan exposure apparatus (which is also called "scanner"). "The step-and-scan manner", as is used herein, is an exposure method that exposes a reticle pattern onto a wafer by continuously scanning the wafer relative to the reticle, and by moving, after a shot of exposure, the wafer stepwise to the next exposure area to be shot. "The step-and-repeat manner" is another mode of exposure method that moves a wafer stepwise to an exposure area for the next shot every short of cell projection.

The exposure apparatus 200 includes, as shown in FIG. 15, an illumination apparatus 210, a reticle stage 230 that mounts the reticle 20, the catadioptric projection optical system 100, a wafer stage 250 that mounts the object 240, a fluid supply-recovery mechanism 260, and a controller (not shown). The controller (not shown) can control and connects with the illumination apparatus 210, the reticle stage 230, the wafer stage 250, and the fluid supply-recovery mechanism 260.

The illumination apparatus illuminates the reticle 220 that forms a circuit pattern to be transferred. It includes a light source unit 212 and an illumination optical system 214.

The light source unit 212 uses, as an example, a light source such as ArF excimer laser with a wavelength of approximately 193 [nm] and KrF excimer laser with a wavelength of approximately 248 [nm]. However, the laser type is not limited to excimer lasers because, for example, $F_2$ laser with a wavelength of approximately 157 [nm] may be used. Similarly, the number of laser units is not limited. For example, two independently acting solid lasers would cause no coherence between these solid lasers and significantly reduce speckles resulting from the coherence. An optical system for reducing speckles may swing linearly or rotationally. A light source applicable to the light source unit 212 is not limited to a laser. One or more lamps, such as a mercury lamp and a xenon lamp, may be used.

The illumination optical system 214 is an optical system that illuminates the reticle 220. It includes a lens, a mirror, a light integrator, a stop, and the like. For example, a condenser lens, a fly-eye lens, an aperture stop, a condenser lens, a slit, and an imaging optical system are arranged in this order. The illumination optical system 214 can use any light regardless of whether it is on-axial or off-axial light. The light integrator may include a fly-eye lens or an integrator formed by stacking two sets of cylindrical lens array plates (or lenticular lenses), and be replaced with an optical rod or a diffractive element.

The reticle 220 is, for example, reflection or penetration reticle, and forms the circuit pattern to be transferred. It is supported and driven by the reticle stage 230. Diffracted light emitted from the reticle 220 passes the catadioptric projection optical system 230. Then it is projected onto the object 240. The reticle 220 and the object 240 are located in an optically conjugate relationship. Since the exposure apparatus 200 of the instant embodiment is a scanner, the reticle 220 and the object 240 are scanned at the speed of the reduction ratio. Thus, the pattern on the reticle 220 is transferred to the object 240. If it is a step-and-repeat exposure apparatus (referred to as a "stepper"), the reticle 220 and the object 240 remain still in exposing the reticle pattern.

The reticle stage 230 supports the reticle 220 via a reticle chuck (not shown), and is connected to a moving mechanism (not shown). The moving mechanism includes a linear motor, etc., and moves the reticle 220 by driving the reticle stage 230 at least in a direction X. The exposure apparatus 200 scans the reticle 220 and the object 240 synchronously by the controller (not shown). Here, X is a scan direction on the reticle 220 or the object 240, Y is a direction perpendicular to it, and Z is a perpendicular direction to the surface of reticle 220 or the object 240.

The catadioptric projection optical system 100 is a catadioptric projection optical system that projects the pattern on the reticle 220 onto the image surface. The catadioptric projection optical system 100 can apply any embodiments as above-mentioned, and a detailed description will be omitted.

The object 240 is, in the instant embodiment, a wafer, which includes a glass plate for the liquid crystal substrate and other objects. Photoresist is applied to the object 240.

The wafer stage 250 supports the object 240 via a wafer chuck (not shown). The wafer stage 250 moves the object 250 in X-Y-Z directions by using a linear motor similar to the reticle stage 230. The positions of the reticle stage 230 and wafer stage 250 are monitored, for example, by a laser interferometer and the like, so that both are driven at a constant speed ratio. The wafer stage 250 is installed on a stage stool supported on the floor and the like, for example, via a dumper, and the reticle stage 230 and the catadioptric projection optical system 100 are installed on a lens barrel stool (not shown) supported, for example, via a dumper to the base frame placed on the floor.

The fluid supply-recovery mechanism 260 supplies the fluid WT between the catadioptric projection optical system 100 and the object 240, which in detail means between the final lens surface at the object 240 side of the catadioptric projection optical system 100 (optical element arranged on the object 240 side final edge of the catadioptric projection optical system 100) and recovers the supplied fluid WT. In other words, the space formed on the catadioptric projection optical system 100 and the surface of the object 240 is filled with the fluid WT supplied from the fluid supply-recovery mechanism 260. The fluid WT is, in the instant embodiment, purewater. However, the fluid WT is not limited to pure water, can use a fluid that has high transmittance property and refractive index property for a wavelength of the exposure light, and high chemical stability to the catadioptric projection optical system 100 and the photoresist spread on the object 240. For example, fluorine system inert fluid may be used.

The controller (not shown) includes a CPU and memory (not shown) and controls operation of the exposure apparatus 200. The controller is electrically connected to the illumination apparatus 210, (the moving mechanism (not shown) for) the reticle stage 230, (the moving mechanism (not shown) for) the wafer stage 250, and the fluid supply-recovery mechanism 260. The controller controls the supply and recover of the fluid WT, switch of stop, and supply and recover amount of the fluid WT based on a condition such as a drive direction of the wafer stage 250 during the exposure. The CPU includes a processor regardless of its name, such as an MPU, and controls each module. The memory includes a ROM and RAM, and stores a firmware for controlling the operations of the exposure apparatus 200.

In exposure, light is emitted from the light source unit 212, e.g., Koehler-illuminated the reticle 220 via the illumination optical system 214. Light that passes through the reticle 220 and reflects the reticle pattern is imaged onto the object 240 by the catadioptric projection optical system 100. The catadioptric projection optical system 100 used for the exposure apparatus 200 has a superior imaging performance, and can provide devices, such as semiconductor chips, such as LSIs and VLSIs, CCDs, LCDs, magnetic sensors, and thin-film magnetic heads, with high throughput and economic efficiency.

Figure 16:
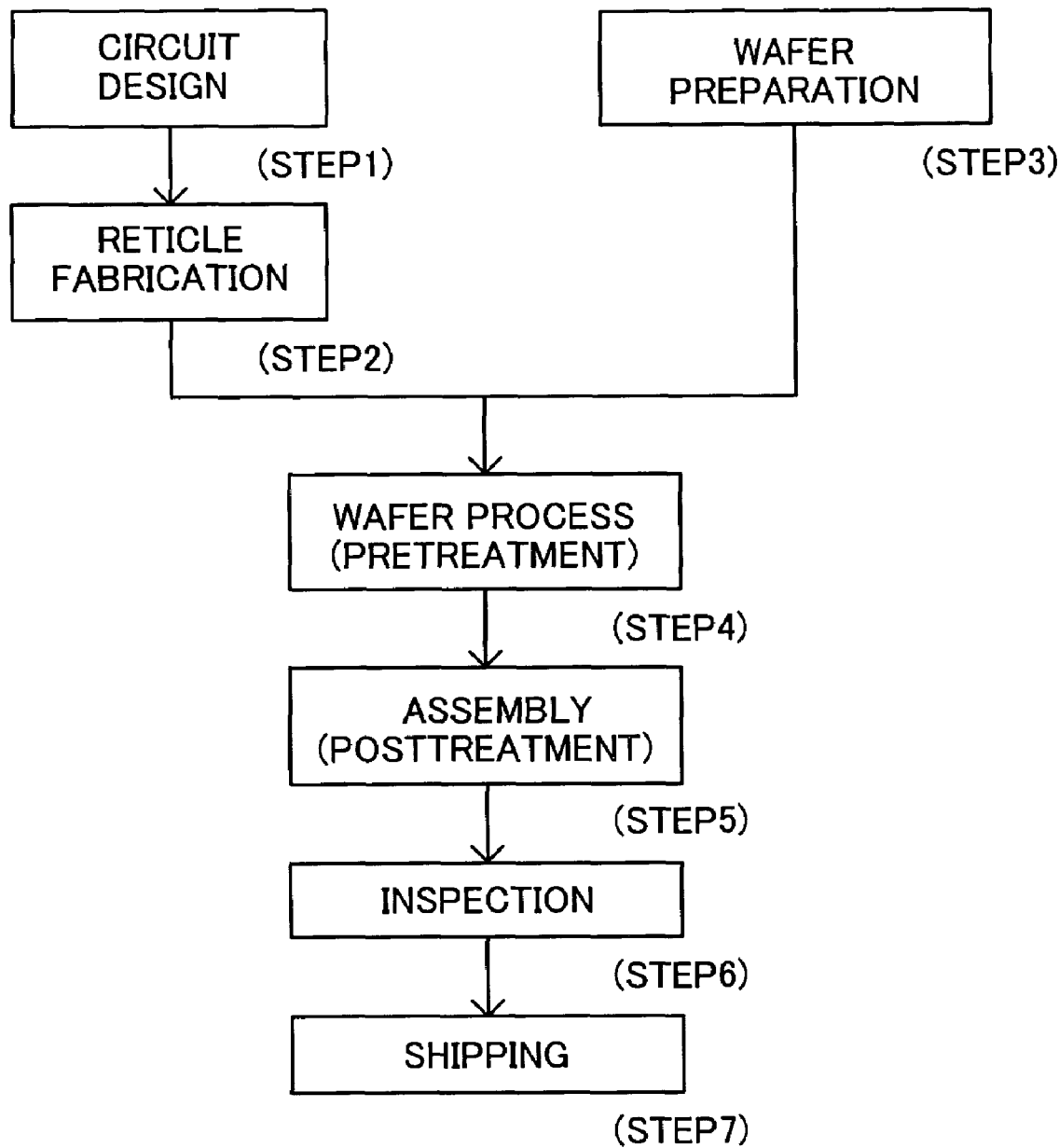
FIG. 16 is a flowchart for explaining how to fabricate devices (such as semiconductor chips such as ICs, LCDs, CCDs, and the like)
Figure 17:
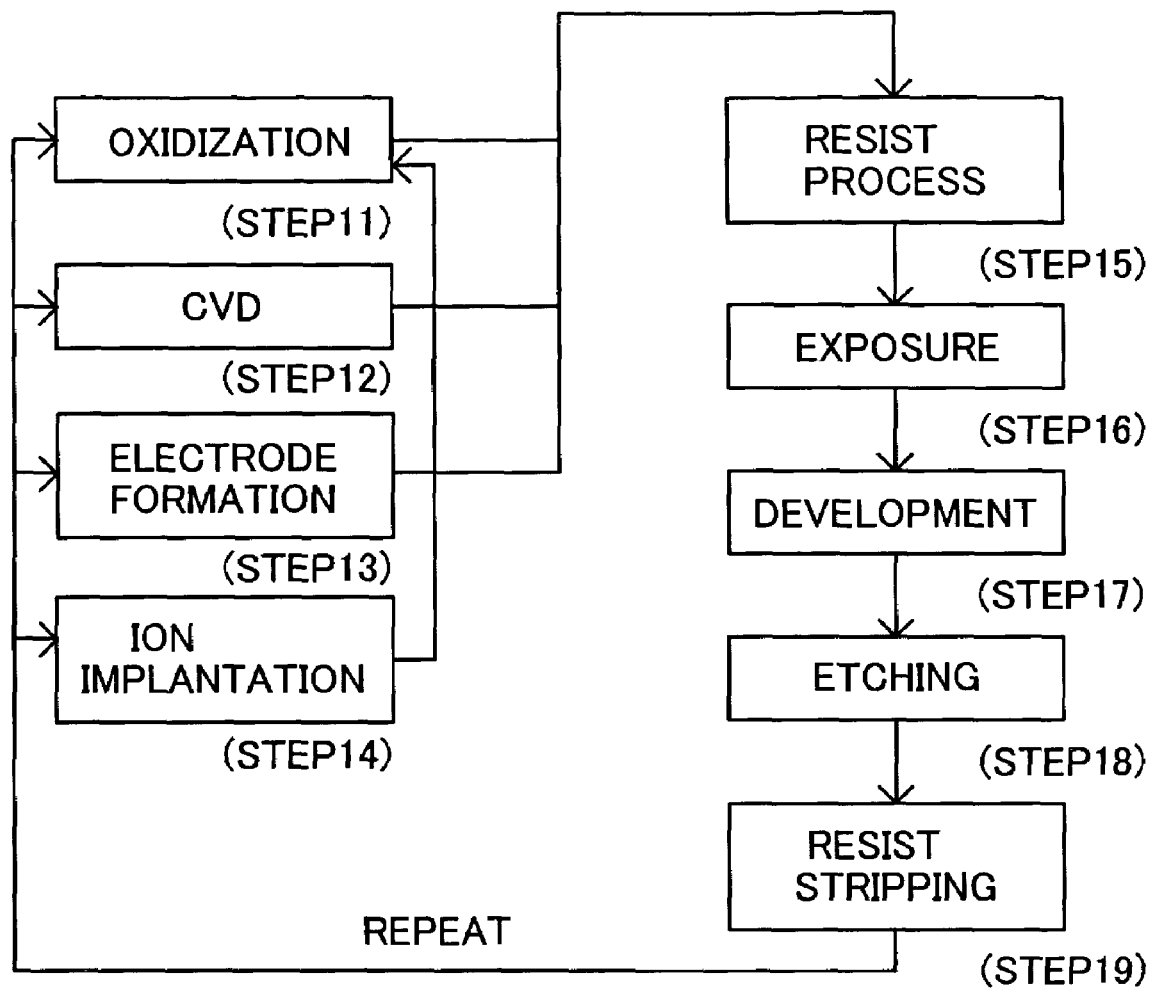
FIG. 17 is a detail flowchart of a wafer process in Step 4 of FIG. 16.

Referring now to FIGS. 16 and 17, a description will be given of an embodiment of a device fabrication method using the above mentioned exposure apparatus 200. FIG. 16 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer making) manufactures a wafer using materials such as silicon. Step 4 (wafer process), which is also referred to as a pretreatment, forms the actual circuitry on the wafer through lithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 17 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 200 to expose a circuit pattern from the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 200, and resultant devices constitute one aspect of the present invention.

Furthermore, the present invention is not limited to these preferred embodiments and various variations and modifications may be made without departing from the scope of the present invention. For example, the present invention can be applied to an exposure apparatus other than the immersion exposure apparatus.

The present invention provides to a catadioptric optical system that can shorten the distance (object-to-image distance) between the first object (reticle) and the second object (wafer) can stability superior image performance, an exposure apparatus having the same, and device fabrication method.

This application claims a foreign priority benefit based on Japanese Patent Applications No. 2004-227364, filed on Aug. 3, 2004, which is hereby incorporated by reference herein in its entirety as if fully set forth herein.

What is claimed is:

1. A catadioptric projection optical system for forming an intermediate image of a first object twice and for forming an image of the intermediate image onto a second object, said catadioptric projection optical system comprising:
    in order from the first object side and along an optical axis of said catadioptric projection optical system,
    a first dioptric group including a first lens group that has a positive refractive power and a second lens group that has a positive refractive power;
    a catadioptric group including a concave mirror and a third lens group that an incidence light and reflected light from said concave mirror pass; and
    a second dioptric group,
    wherein a first deflective reflector is arranged between the first lens group and the second lens group,
    a second deflective reflector is arranged between the second lens group and the third lens group or between the third lens group and the second dioptric group,
    a first intermediate image is formed between the second lens group and the concave mirror, and
    a second intermediate image is formed between the concave mirror and the second dioptric group.

2. A catadioptric projection optical system according to claim 1, wherein each normal of the first deflective reflector and the second deflective reflector are arranged to be substantially 90 degrees.

3. An exposure apparatus comprising:
    an illumination optical system for illuminating a reticle with a light from a light source; and
    a catadioptric projection system for projecting a pattern of the reticle onto an object to be exposed, said catadioptric projection optical system according to claim 1.

4. An exposure apparatus according to claim 3, wherein at least a part of between the object and a lens surface at the object side of the catadioptric projection optical system is filled with a fluid.

5. A device fabrication method comprising the steps of:
    exposing an object using an exposure apparatus according to claim 3; and
    performing a development process for the object exposed.

6. A catadioptric projection optical system according to claim 1, wherein $0.4<|\beta L1/\beta|<24$ is met, where $\beta L1$ is a paraxial magnification of the first dioptric group, and $\beta$ is a paraxial magnification of entire system.

7. A catadioptric projection optical system according to claim 1, wherein $0.01<|\beta L3/NA|<0.3$ is met, where $\beta L3$ is a paraxial magnification of the second dioptric group, and NA is a numerical aperture of the second object side.

* * * * *